(12) United States Patent
Lin et al.

(10) Patent No.: US 12,218,227 B2
(45) Date of Patent: Feb. 4, 2025

(54) SEMICONDUCTOR STRUCTURE

(71) Applicant: Taiwan Semiconductor Manufacturing Company, Ltd., Hsinchu (TW)

(72) Inventors: Shih-Hao Lin, Hsinchu (TW); Chia-Hung Chou, Hsinchu (TW); Chih-Hsuan Chen, Hsinchu (TW); Ping-En Cheng, Hsinchu (TW); Hsin-Wen Su, Yunlin County (TW); Chien-Chih Lin, Taichung (TW); Szu-Chi Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,932

(22) Filed: Aug. 10, 2023

(65) Prior Publication Data

US 2023/0395703 A1    Dec. 7, 2023

Related U.S. Application Data

(63) Continuation of application No. 17/332,025, filed on May 27, 2021, now Pat. No. 11,742,416.

(51) Int. Cl.
*H01L 29/66* (2006.01)
*H01L 21/8234* (2006.01)
*H01L 29/78* (2006.01)

(52) U.S. Cl.
CPC .. *H01L 29/6681* (2013.01); *H01L 21/823431* (2013.01); *H01L 21/823468* (2013.01); *H01L 29/66553* (2013.01); *H01L 29/6656* (2013.01); *H01L 29/7851* (2013.01)

(58) Field of Classification Search
CPC .......... H01L 29/6681; H01L 29/66553; H01L 29/6656; H01L 29/7851; H01L 21/823431; H01L 21/823468
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |

(Continued)

*Primary Examiner* — Christine A Enad
(74) *Attorney, Agent, or Firm* — Birch, Stewart, Kolasch & Birch, LLP

(57) ABSTRACT

A semiconductor structure includes substrate, semiconductor layers, source/drain features, metal oxide layers, and a gate structure. The semiconductor layers extend in an X-direction and over the substrate. The semiconductor layers are spaced apart from each other in a Z-direction. The source/drain features are on opposite sides of the semiconductor layers in the X-direction. The metal oxide layers cover bottom surfaces of the semiconductor layers. The gate structure wraps around the semiconductor layers and the metal oxide layers. The metal oxide layers are in contact with the gate structure.

20 Claims, 21 Drawing Sheets

(56) References Cited

U.S. PATENT DOCUMENTS

| | | | |
|---|---|---|---|
| 9,608,116 B2 | 3/2017 | Ching et al. | |
| 10,263,100 B1* | 4/2019 | Bi | H01L 29/42364 |
| 10,854,612 B2 | 12/2020 | Cho et al. | |
| 2016/0240375 A1* | 8/2016 | Dargis | C30B 29/403 |
| 2019/0309413 A1* | 10/2019 | Wu | C30B 29/16 |
| 2020/0052131 A1* | 2/2020 | Chen | H01L 21/823807 |
| 2020/0365586 A1 | 11/2020 | Shin et al. | |

* cited by examiner

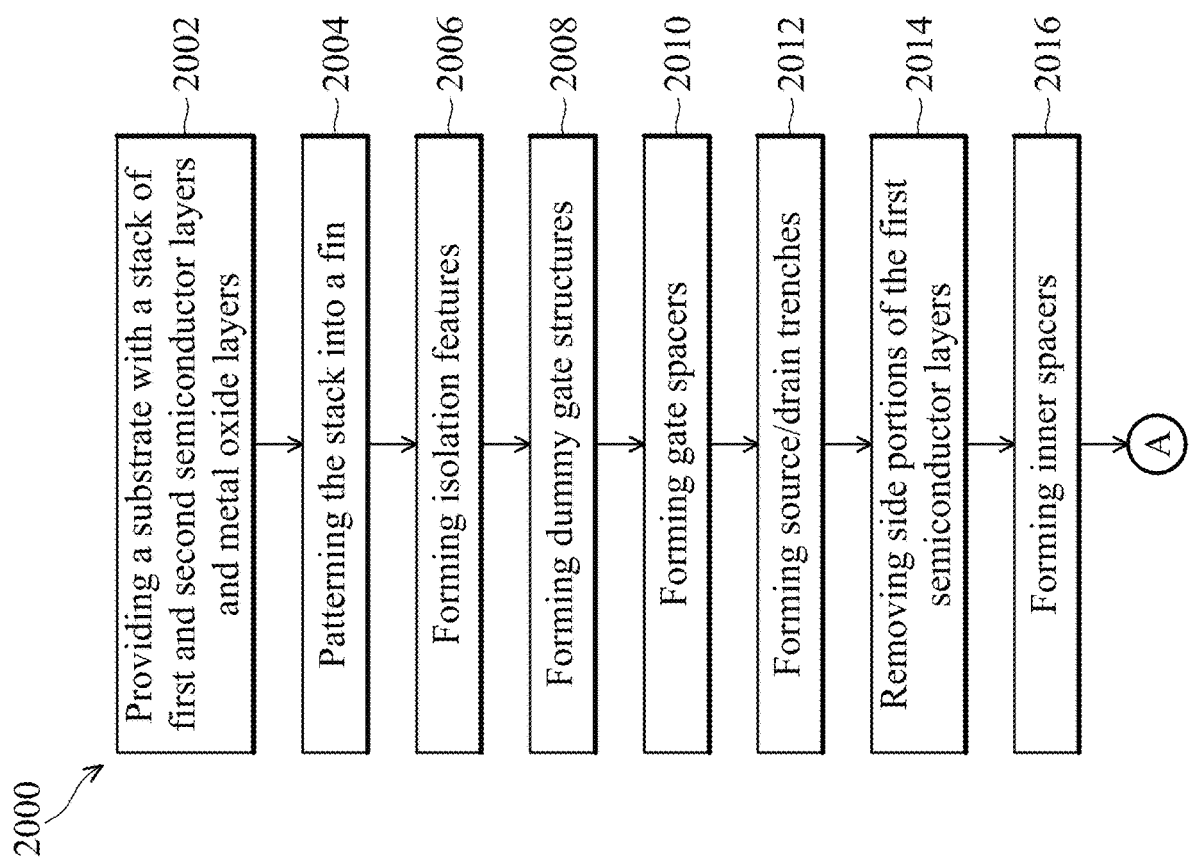

SEMICONDUCTOR STRUCTURE

CROSS REFERENCE TO RELATED APPLICATIONS

This application is a Continuation of U.S. application Ser. No. 17/332,025, filed on May 27, 2021, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins. However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are a flow chart of an example method for fabricating an embodiment of a GAA device, in accordance with some embodiments.

DETAILED DESCRIPTION

Figure 1:
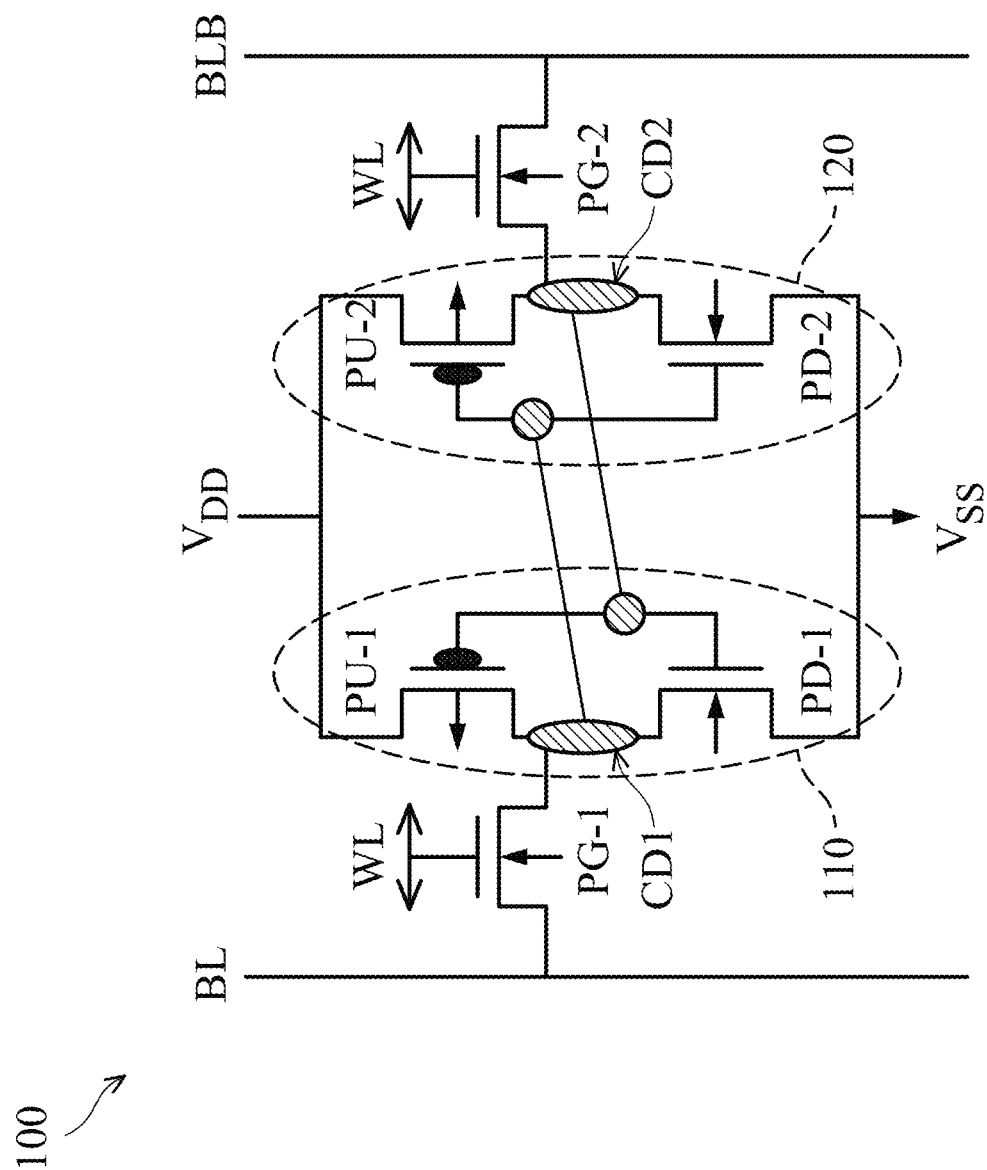
FIG. 1 is a circuit diagram of a SRAM cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional gate-all-around (GAA) FETs, in memory (e.g., SRAM) and/or standard logic cells of an integrated circuit (IC) structure. Generally, a GAA FET may include a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. Specifically, dopants in a well region of a substrate and source/drain epi regions may out-diffuse into channel regions to degrade characteristics of GAA FETs in memory (e.g., SRAM) and/or standard logic cells. For example, the dopants out-diffused into channel regions may cause threshold voltage (Vt) variation of transistors in different regions on the same wafer, higher minimum operating voltage (Vccmin) of the SRAM cells, serious drain-induced barrier lowering (DIBL) effect, larger subthreshold leakage current, and degraded carrier mobility.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including metal oxide layers or metal containing layers to retard dopants of well and epi regions for logic cell mobility and SRAM cell margin improvement. In various embodiments, the disclosed metal oxide layers may provide as barrier to prevent the dopants passing through thin regions of the inner spacers into the channel regions.

In some embodiments, the IC device may include GAA devices. The GAA devices may be fabricated during processing of the IC device, or a portion thereof, which may include static random access memory (SRAM) and/or logic circuits, passive components such as resistors, capacitors, and inductors, and active components such as p-type field effect transistors (pFETs), n-type FETs (nFETs), FinFETs, MOSFETs, CMOS, bipolar transistors, high voltage transistors, high frequency transistors, other memory cells, and combinations thereof.

FIG. 1 is a circuit diagram of a SRAM cell 100, in accordance with some embodiments. FIG. 1 has been simplified for the sake of clarity to better understand the inventive concepts of the present disclosure. The SRAM cell 100 may include six transistors: a pass-gate transistor PG-1, a pass-gate transistor PG-2, a pull-up transistor PU-1, a pull-up transistor PU-2, a pull-down transistor PD-1, and a pull-down transistor PD-1. The SRAM cell 100 is thus alternatively referred to as a 6T SRAM cell. In operation, the pass-gate transistor PG-1 and the pass-gate transistor PG-2 provide access to a storage portion of SRAM cell 100, which includes a cross-coupled pair of inverters, an inverter 110 and an inverter 120. The Inverter 110 includes pull-up transistor PU-1 and pull-down transistor PD-1, and the inverter 120 includes pull-up transistor PU-2 and pull-down transistor PD-2. In some implementations, the pull-up transistors PU-1, PU-2 are configured as p-type transistors, and the pull-down transistors PD-1, PD-2, as well as pass-gate transistors PG-1, PG-2, are configured as n-type transistors.

A gate of pull-up transistor PU-1 interposes a source (electrically coupled with a power supply voltage (VDD)) and a first common drain (CD1), and a gate of pull-down transistor PD-1 interposes a source (electrically coupled with a power supply voltage (VSS)) and the first common drain. A gate of pull-up transistor PU-2 interposes a source (electrically coupled with power supply voltage (VDD)) and a second common drain (CD2), and a gate of pull-down transistor PD-2 interposes a source (electrically coupled with power supply voltage (VSS)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, complementary bit line BLB in response to voltage applied to the gates of pass-gate transistors PG-1, PG-2 by word lines WL.

Figure 2B:
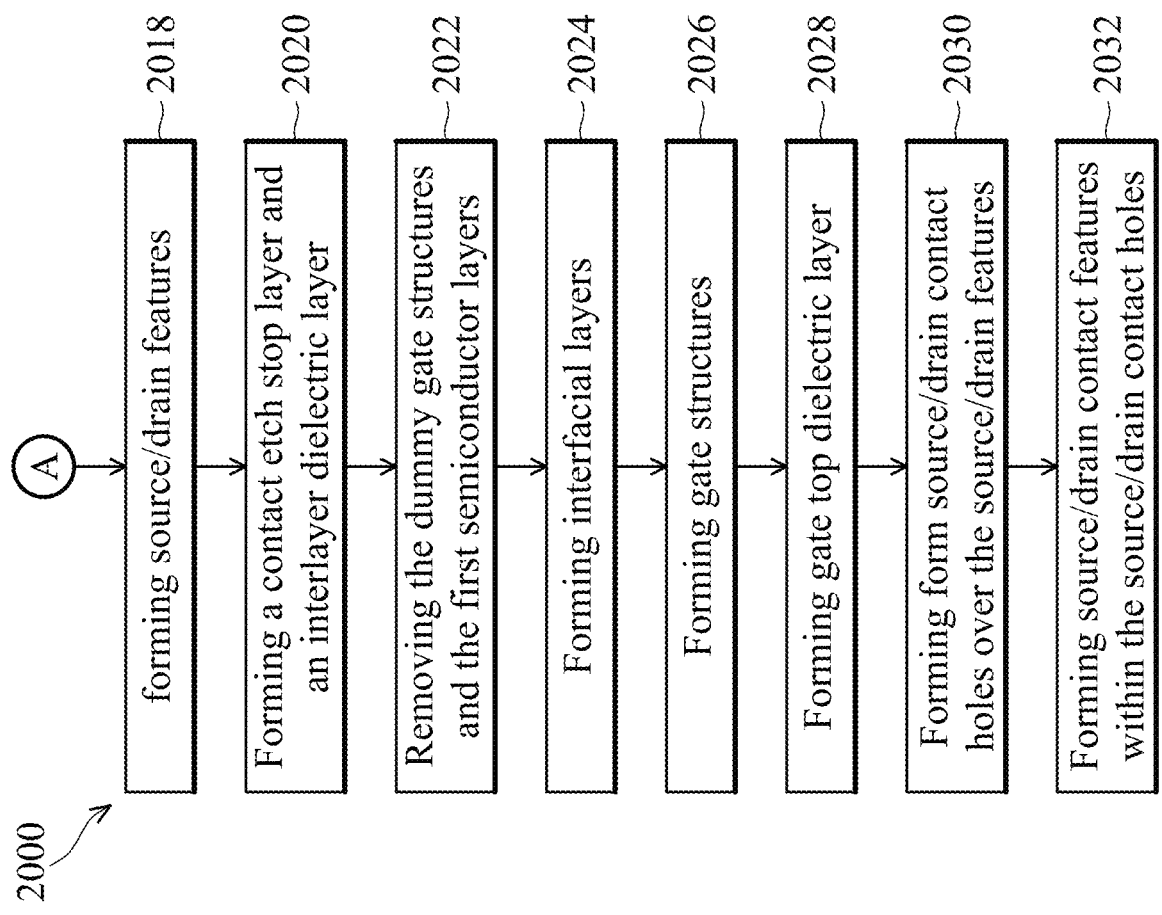

FIGS. 2A and 2B are flow charts of an example method 2000 for fabricating an embodiment of a GAA device 100 of a SRAM and/or a logic cell according to some embodiments of the present disclosure. FIGS. 3, 4, 5, 6, and 7 are isometric views of the embodiment of the GAA device 100 constructed at various fabrication stages according to some embodiments of the present disclosure. FIGS. 8, 9, 10, 11, 12, 13, 14, 15, 16, 17, 18, and 19 are cross sectional views of the embodiment of the GAA device 100 constructed at various fabrication stages, according to some embodiments of the present disclosure.

Figure 3:
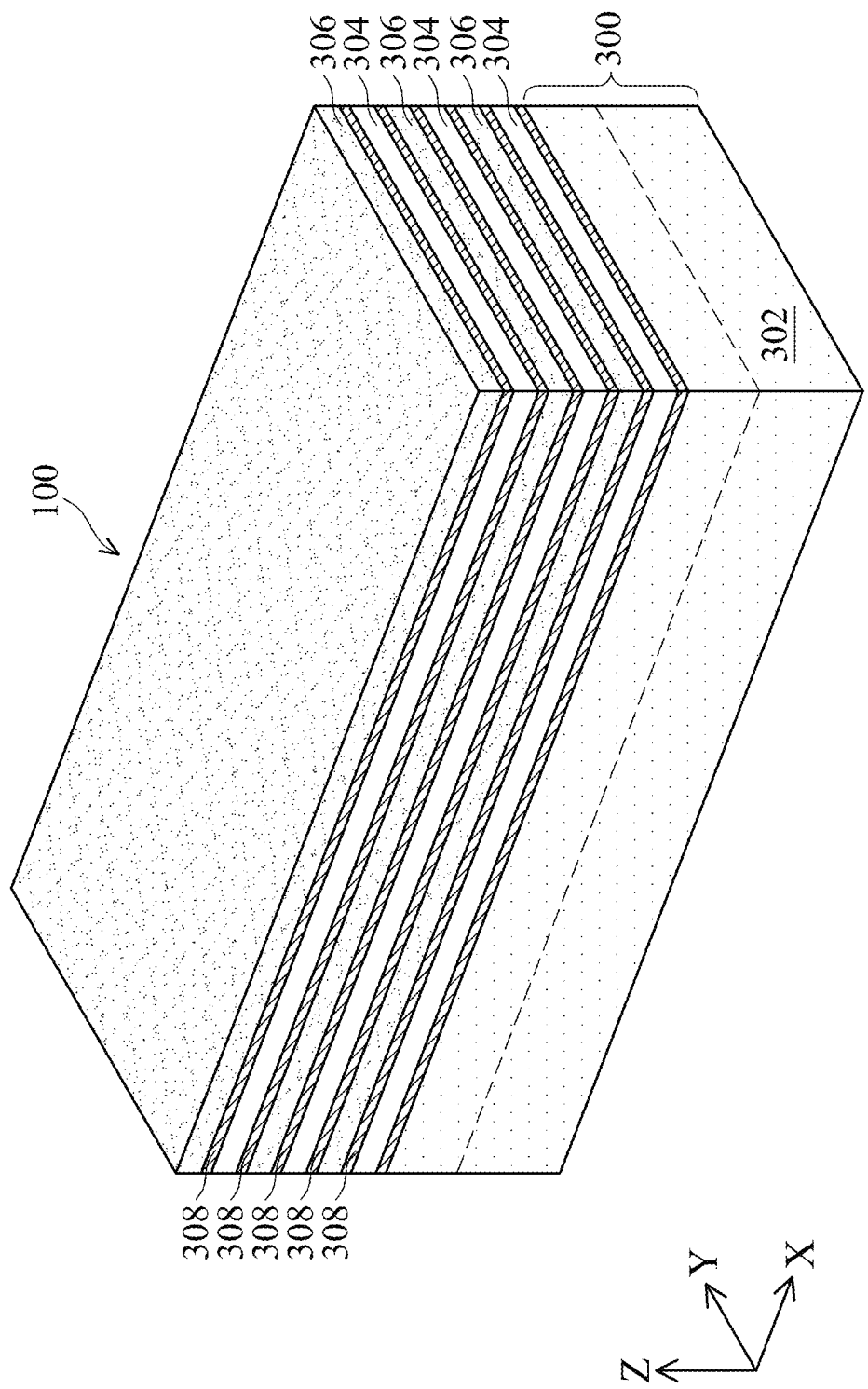
FIGS. 3, 4, 5, 6, and 7 are isometric views of an embodiment of a GAA device of the present disclosure constructed at various fabrication stages, in accordance with some embodiments.

Referring to operation 2002 of FIG. 2A and FIG. 3, the GAA device 100 may include a substrate 300 with semiconductor layers 304, 306 and metal oxide layers 308 over it. In some embodiments, the substrate 300 contains a semiconductor material, such as bulk silicon (Si). Alternatively or additionally, another elementary semiconductor, such as germanium (Ge) in a crystalline structure, may also be included in the substrate 300. The substrate 300 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 300 may also include a semiconductor-on-insulator substrate, such as Si-on-insulator (SOI), SiGe-on-insulator (SGOI), Ge-on-insulator (GOI) substrates.

The substrate 300 may include various doped regions configured according to design requirements of GAA device 100. In some embodiments, the substrate 300 may include a doped region 302 (also referred to as a well region). The doped region 302 may be an n-type doped region (also referred to as an n-well) or a p-type doped region (also referred to as a p-well), and the n-type doped region is configured for a p-type metal-oxide-semiconductor (PMOS) transistor and the p-type doped region is configured for an n-type MOS (NMOS) transistor. N-type doped region is doped with n-type dopants, such as phosphorus, arsenic, other n-type dopant, or combinations thereof. P-type doped region is doped with p-type dopants, such as boron (for example, BF2), indium, other p-type dopant, or combinations thereof. In the present embodiment, the substrate 300 shows one doped region 302. In other embodiments, substrate 300 may include multiple doped regions formed with a combination of p-type dopants and n-type dopants. An ion implantation process, a diffusion process, and/or other suitable doping process can be performed to form the various doped regions. In some embodiments, n-type doped region has an n-type dopant concentration of about 5×10^16 cm-3 to about 5×10^19 cm-3, and p-type doped region has a p-type dopant concentration of about 5×10^16 cm-3 to about 5×10^19 cm-3.

Still referring to operation 2002 of FIG. 2A and FIG. 3, a stack of semiconductor layers 304 and 306 and metal oxide layers 308 are formed over the substrate 200, and the semiconductor layers 304 and 306 are alternating stacked and the metal oxide layers are interposed between each of the semiconductor layers 304 and 306. The stack extends vertically (e.g., in the Z-direction) from the substrate 200. For example, a semiconductor layer 304 is formed over the substrate 200, a semiconductor layer 306 is formed over the semiconductor layer 304, another semiconductor layer 306 is formed over the semiconductor layer 304, and so forth.

In some embodiments, three semiconductor layers 304 alternate with three semiconductor layers 306 in the stack. However, there may be another appropriate number of layers in the stack. For example, there may be from 2 to 10 semiconductor layers 304 alternating with 2 to 10 semiconductor layers 306 in the stack. The material compositions of the semiconductor layers 304 and 306 are configured so that they have etching selectivity in a subsequent etching process. For example, in the present embodiment, semiconductor layers 304 contain silicon germanium (SiGe), while semiconductor layers 306 contain silicon (Si). In some embodiments, the semiconductor layers 304 and 306 are epitaxially grown over (on) the substrate 300 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

As discussed above, still referring to FIG. 3, metal oxide layers 308 are formed and interpose between the semiconductor layers 304 and 306 during the formation of the stack of semiconductor layers 304 and 306. Specifically, two of the metal oxide layers 308 are formed on the top surface and the bottom surface of each semiconductor layer 304. For example, during the formation of the stack of semiconductor layers 304 and 306, a metal oxide layer 308 is formed before the formation of a semiconductor layer 304, and another metal oxide layer 308 is formed before the formation of another semiconductor layer 304, but after the formation of the previous semiconductor layer 304. In some embodiments, the topmost surface of the semiconductor layers 306 is higher than the metal oxide layers 308. In other words, the metal oxide layer 308 is not formed over the topmost semiconductor layer 306. The metal oxide layers 308 may include rare earth elements, such as lanthanum (La), gadolinium (Gd), yttrium (Y), and combinations thereof. More specifically, the metal oxide layers 308 are made of rare earth oxide, examples of which include lanthanum oxide ($LaO_x$), gadolinium oxide ($Gd_2O_3$), yttrium oxide ($YO_x$), and combinations thereof. Therefore, the metal oxide layers 308 may also be referred to as rare earth oxide layers.

In order to form thin and high-quality metal oxide layers, the metal oxide layers 308 are formed by the ALD process in accordance with some embodiments. The ALD process is performed at a process temperature in a range from about 300° C. to about 800° C. in accordance with some embodiments. In some embodiments, each of the metal oxide layers 308 may have a thickness (e.g., measured in the Z-direction) in a range from about 1 nm to about 5 nm. The metal oxide layers 308 may not retard or block dopants if it is not thick enough; and the metal oxide layers 308 may badly bond to the semiconductor 306 if it is too thick, causing degraded carrier mobility. Further, the metal oxide layers 308 have a crystal structure for goodly bonding the semiconductor 306, so that the mobility of the carriers in channel region (e.g., the semiconductor layers 306) may not be degraded. In some embodiments, the metal oxide layers 308 are made of lanthanum oxide ($LaO_x$) and have a crystal structure of a hexagonal phase. In some embodiments, the metal oxide layers 308 are made of gadolinium oxide ($Gd_2O_3$) and have a crystal structure of a cubic phase. In other embodiments, the metal oxide layers 308 are made of yttrium oxide ($YO_x$) and have a crystal structure of a cubic phase or a hexagonal phase. As discussed above, the metal oxide layers 308 are used for retarding or blocking dopants from doped region 302 and epi regions formed in subsequent process, it will be described in more details below.

Figure 4:
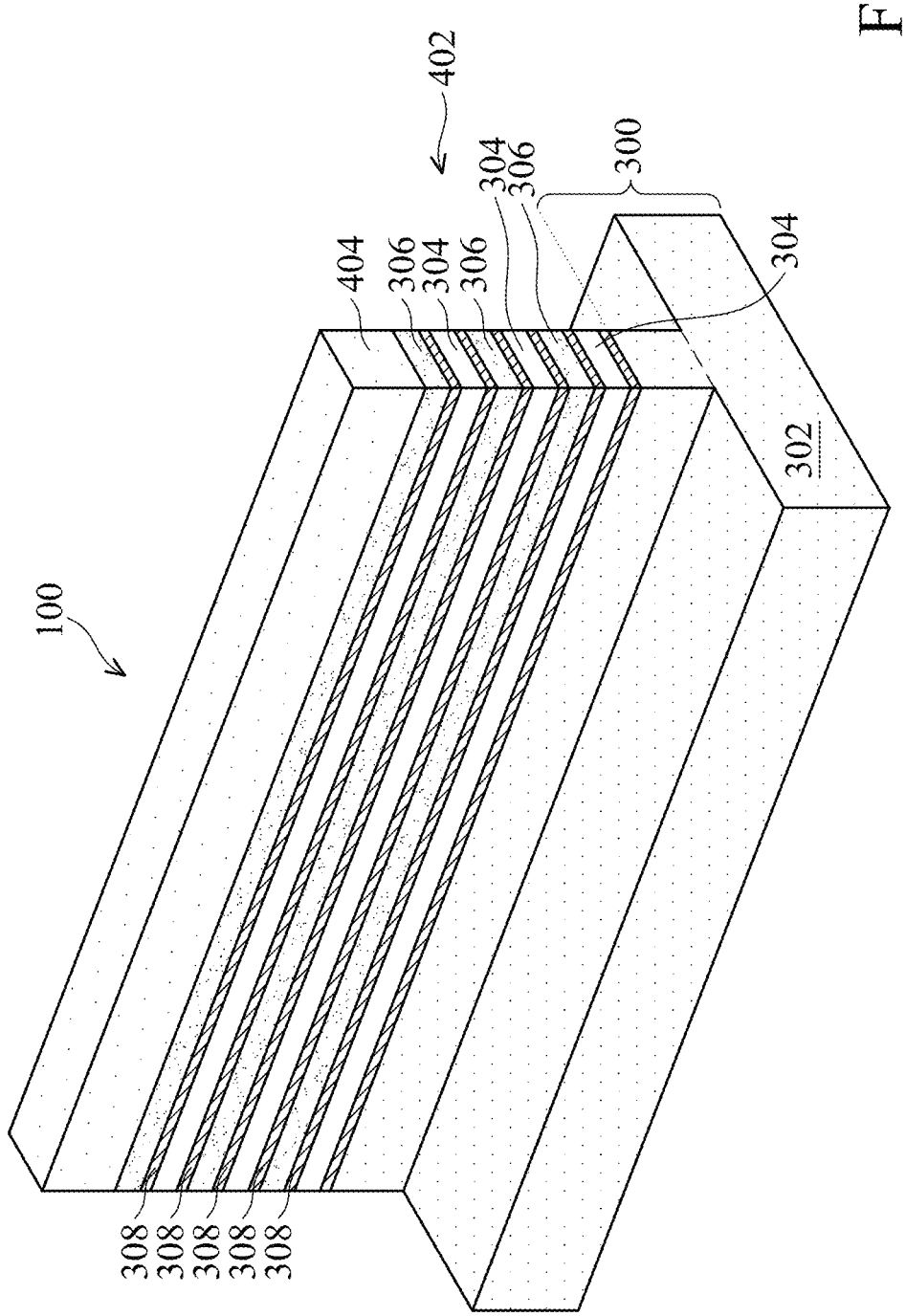

Referring to operation 2004 of FIG. 2A and FIG. 4, the stack of semiconductor layers 220A and 220B and metal oxide layers 308 are patterned into a fin 402. The fin 402 may include the semiconductor layers 304 and 306 alternating stacked, with the metal oxide layers 308 interposing between each of the semiconductor layers 304 and 306. The fin 402 extends lengthwise (e.g., longitudinally) in the X-direction, as shown in FIG. 3. The fin 402 may be patterned using any suitable method. In the present embodiment, the patterning process of the fin 402 may include forming a mask structure 404 over the stack shown in FIG. 3 and performing one or more etching processes to etch the stack and top portions of the substrate 300 not covered by the mask structure 404 to form the fin 402. In some embodiments, the mask structure 404 may be formed using photolithography and removal (e.g., etching) processes. In some embodiments, the mask structure 404 may include photoresist materials or hard mask materials. The mask structure 404 is removed in a subsequent process.

Figure 5:
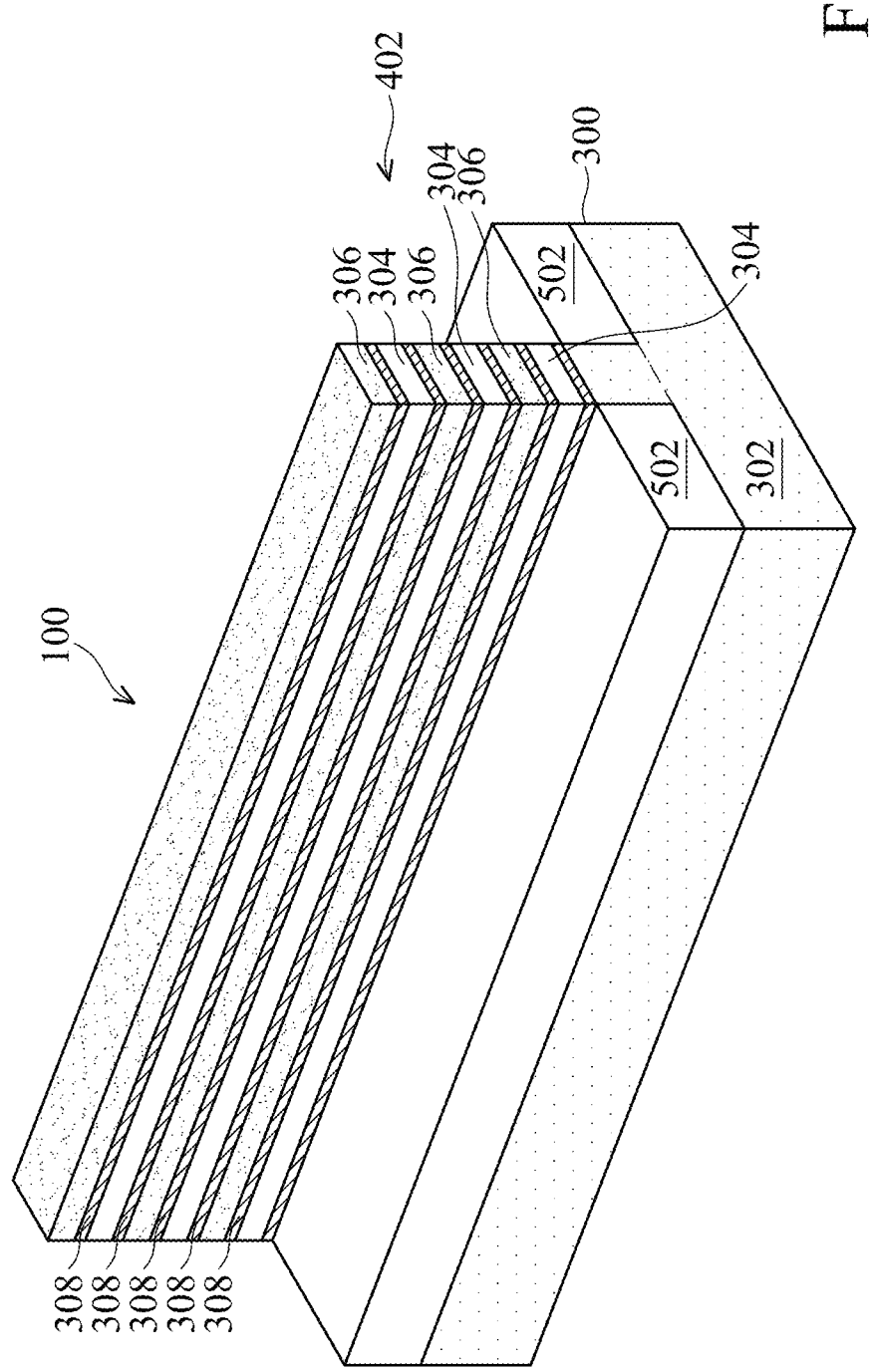

Referring to operation 2006 of FIG. 2A and FIG. 5, isolation features 502 are formed over the substrate 300. The isolation features 502 may be shallow trench isolation (STI) features that provide electrical isolation between the different GAA devices, in some embodiments. In some embodiments, the isolation features 502 may include a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 502. The isolation features 502 may have a multi-layer structure such as a thermal oxide liner layer over the substrate 300 and a filling layer (e.g., silicon nitride or silicon oxide) over the thermal oxide liner layer. Alternatively, the isolation features 502 may be formed using any other isolation formation techniques. As shown in FIG. 5, the fin 402 is located above the top surface of the isolation features 502 (e.g., protrude out of the isolation features 502) and is also located above the top surface of the substrate 300.

Figure 6:
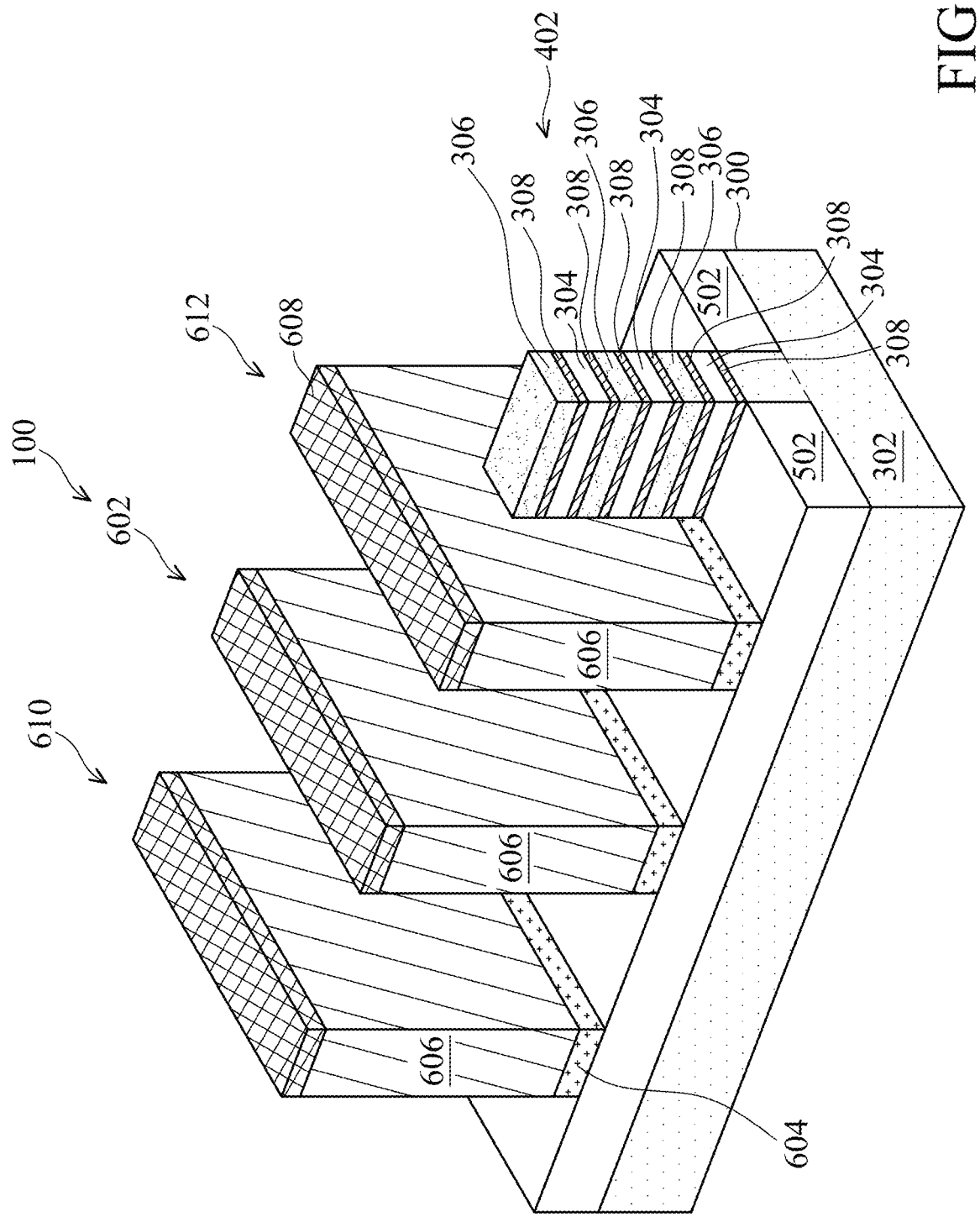

Referring to operation 2008 of FIG. 2A and FIG. 6, a dummy gate structure 602 may be formed over a portion of the fin 402 and over the isolation features 502. The dummy gate structure 602 may be configured to extend along the Y-direction and wrap around the top surface and side surfaces of the fin 402, as shown in FIG. 6. In some embodiments, to form the dummy gate structure 602, a dummy interfacial material of a dummy interfacial layer 604 is first formed over fin 402 and over the isolation features 502. In some embodiments, the dummy interfacial layer 604 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 606 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD). In some embodiments, a mask structure 608 is formed over the dummy gate material and directly overlies the fin 402. In some embodiments, the mask structure 608 may be formed using photolithography and removal (e.g., etching) processes. In some embodiments, the mask structure 608 may include photoresist materials or hard mask materials. After the formation of the mask structure 608, a removal process (e.g., etching) may be performed to remove portions of the dummy gate material and the dummy interfacial material that do not directly underlie the mask structure 608, thereby forming the dummy gate structure 602 with dummy gate electrode 606 and the dummy interfacial layer 604. The dummy gate structures 602 may undergo a gate replacement process through subsequent processing to form metal gates, such as a high-k metal gate, as discussed in greater detail below.

FIG. 6 also shows other two dummy gate structures 610 and 612 formed on both sides of the dummy gate structure 602 of the GAA device 100. In some embodiments, the dummy gate structures 610 and 612 may be used as dummy gate structures of other two GAA devices sharing source/drain regions with the GAA device 100. In other embodiments, the dummy gate structures 610 and 612 may also undergo a gate replacement process to form dielectric based gates that electrically isolate the GAA device 100 from neighboring devices.

Figure 7:
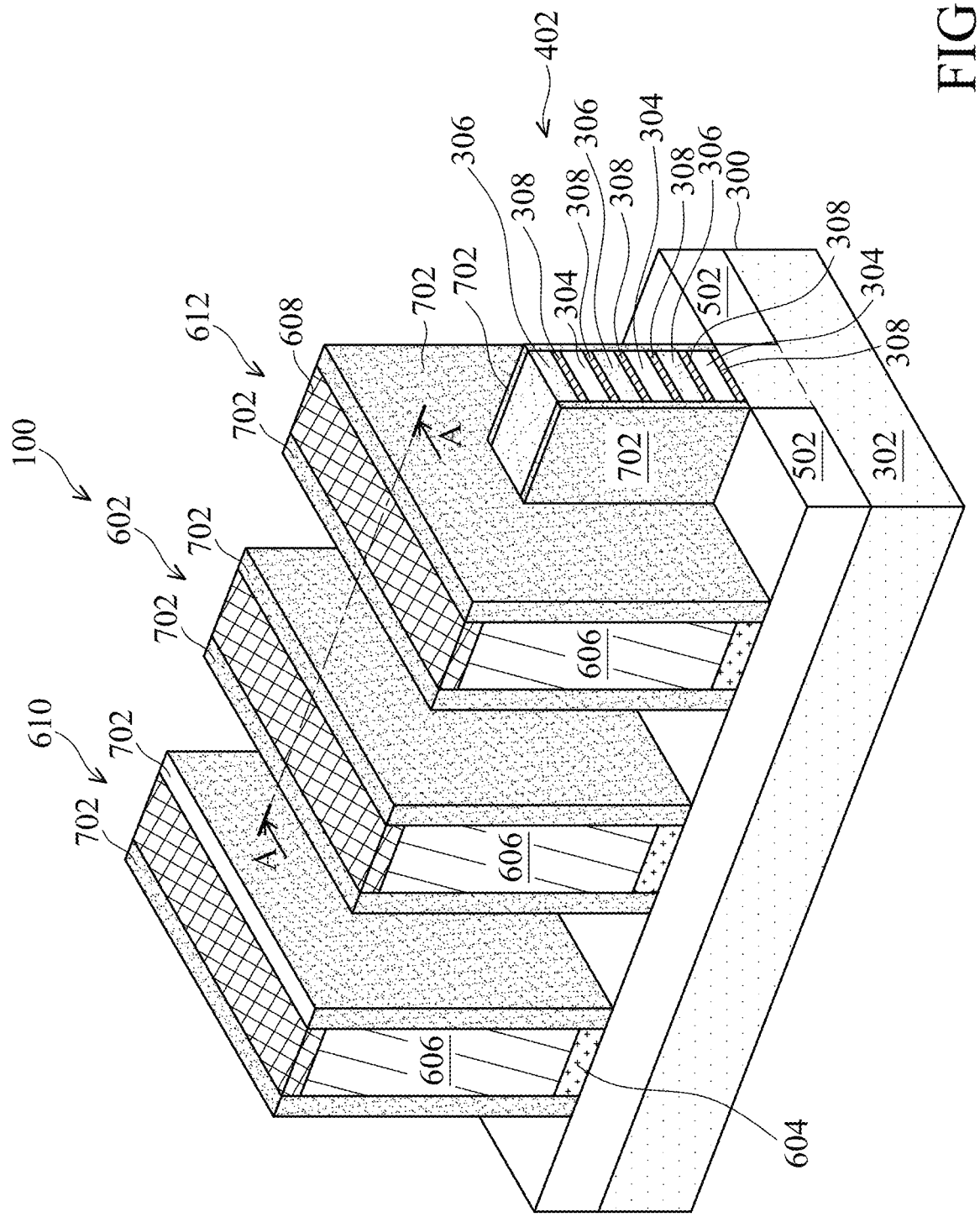

Referring to operation 2010 of FIG. 2A and FIG. 7, gate spacers 702 are formed on the sidewalls of the dummy gate structures 602, 610, and 612, over the top surfaces of the fin 402, and the sidewalls of the fin 402. The gate spacers 702 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 702 may include a single layer or a multi-layer structure. In some embodiments, the gate spacers 702 may be formed by depositing a spacer layer (containing the dielectric material) over the isolation features 502, the fin 402, and dummy gate structures 602, 610, and 612, followed by an anisotropic etching process to remove top portions of the spacer layer from the top surfaces of the isolation features 502, the fin 402, and dummy gate structures 602, 610, and 612. After the etching process, portions of the spacer layer on the sidewall surfaces of the fin 402 and the dummy gate structures 602, 610, and 612 substantially remain and become the gate spacers 702. In some embodiments, the anisotropic etching process is a dry (e.g., plasma) etching process. Additionally or alternatively, the formation of the gate spacers 702 may also involve chemical oxidation, thermal oxidation, ALD, CVD, and/or other suitable methods. The gate spacers 702 may also be interchangeably referred to as the top spacers.

Figure 8:
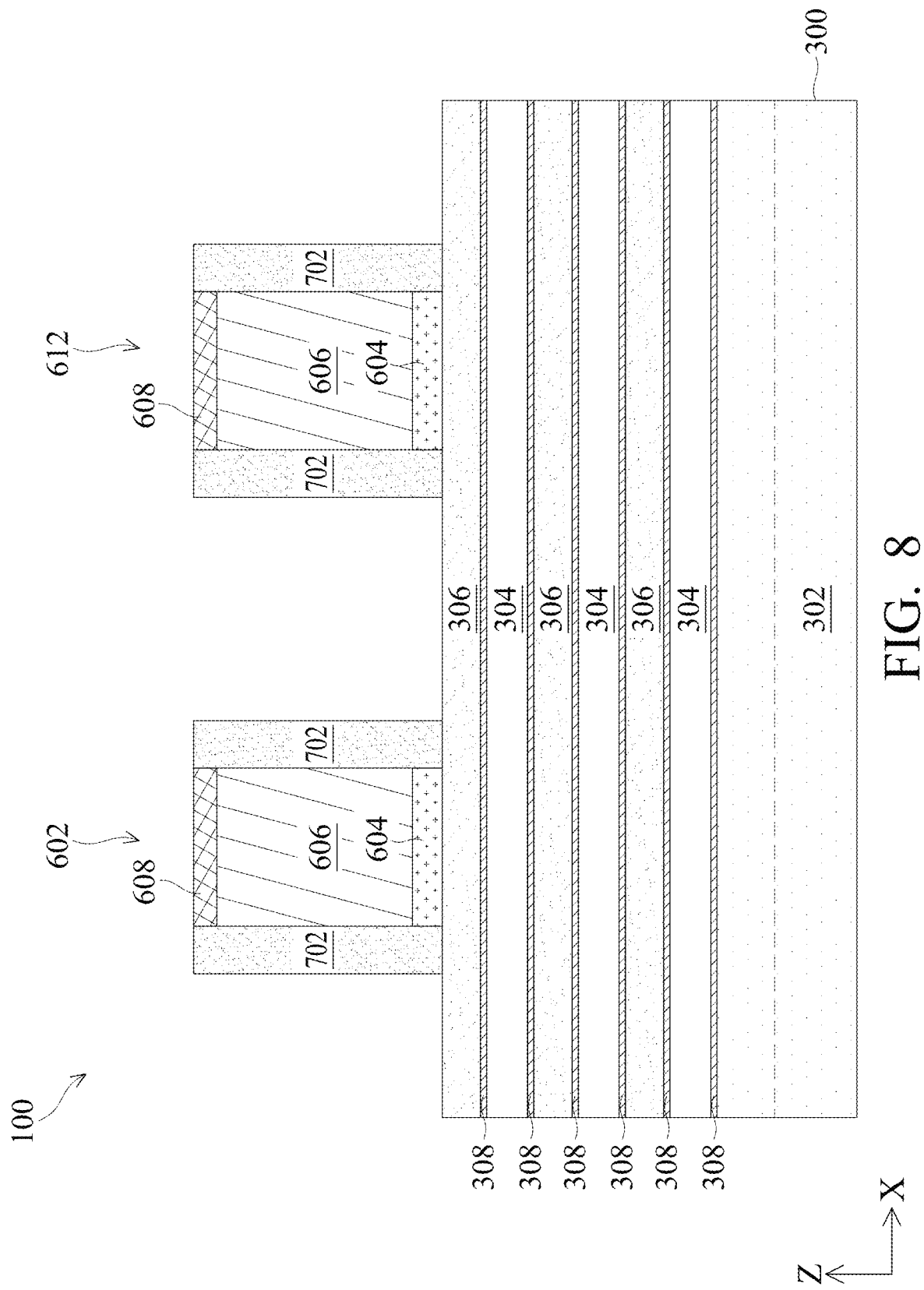
FIGS. 8, 9, 10, 11, 12, 13, 14, 15, 16, 17, 18, and 19 are cross sectional views of an embodiment of a GAA device of the present disclosure constructed at various fabrication stages, in accordance with some embodiments.
Figure 9:
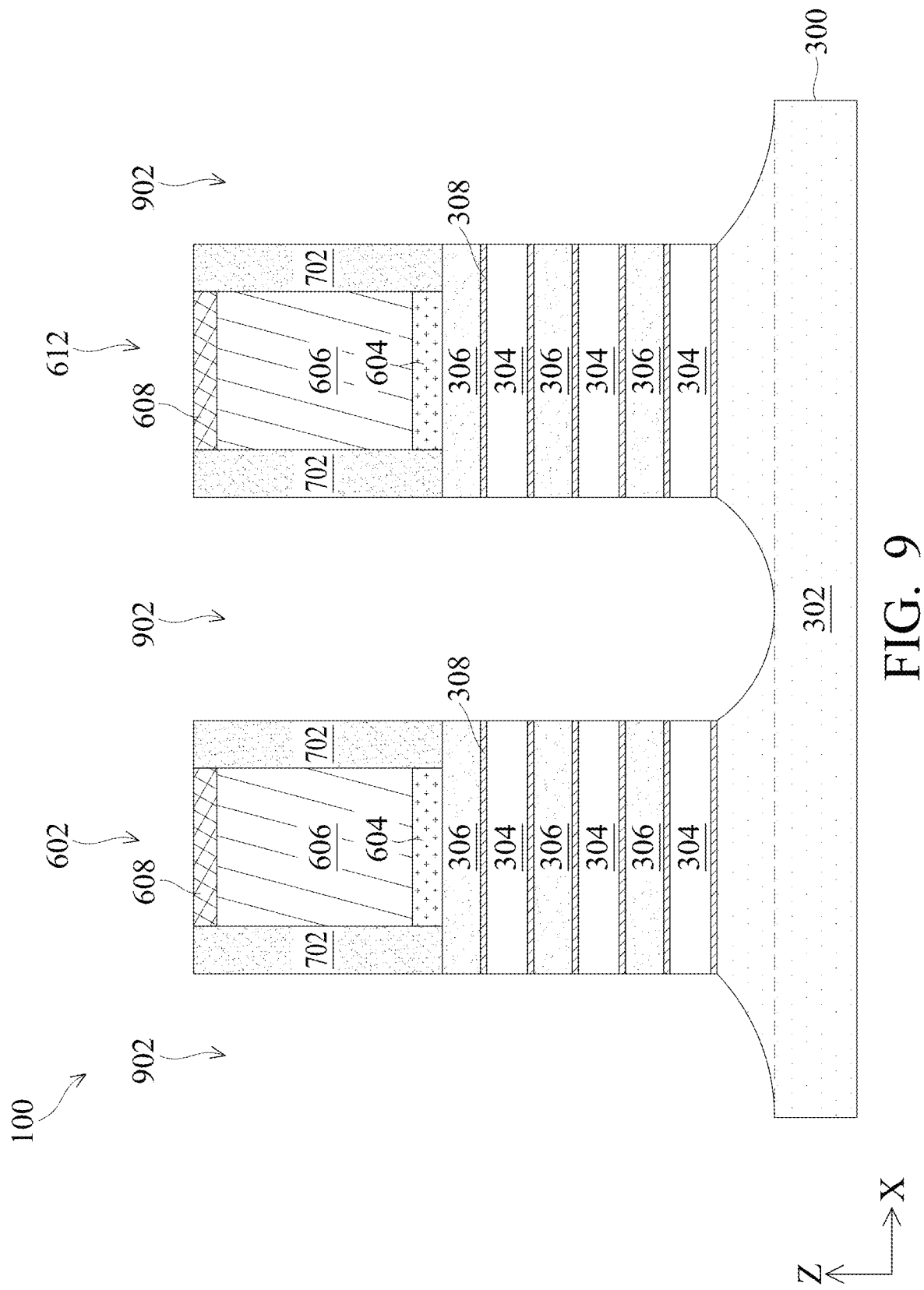

FIG. 8 is a cross-sectional view of the embodiment of a portion of the GAA device 100 that may correspond to cross-section line A-A of FIG. 7. As shown in FIG. 8, the dummy gate structures 602 and 612 and the gate spacers 702 overlap the semiconductor layers 304, 306, and metal oxide layers 308. Further, portions of the semiconductor layers 304, 306, and metal oxide layers 308 are exposed by the dummy gate structures 602 and 612, and the gate spacers 702. These exposed portions are at least partially recessed (or etched away) to form source/drain trenches for subsequent epitaxial source and drain growth. Referring to operation 2012 of FIG. 2A and FIG. 9, source/drain trenches 902 are formed in the fin 402 exposed by the dummy gate structures 602 and 612. Specifically, the source/drain trenches 902 may be formed by performing one or more etching processes to remove portions of the semiconductor layers 304, the semiconductor layers 306, the metal oxide layers 308, and the substrate 300 that do not vertically overlap or be covered by the dummy gate structures 602 and 612, and gate spacers 702. In some embodiments, a single etchant may be used to remove the semiconductor layers 304, the semiconductor layers 306, the metal oxide layers 308, and the substrate 300, whereas in other embodiments, multiple etchants may be used to perform the etching process. As shown in FIG. 9, portions of the substrate 300 are etched so that the source/drain trenches 902 each has a concave surface in the substrate 300, and the concave surface is lower than the top surfaces of the isolation features 502 (not shown in FIG. 9).

Figure 10:
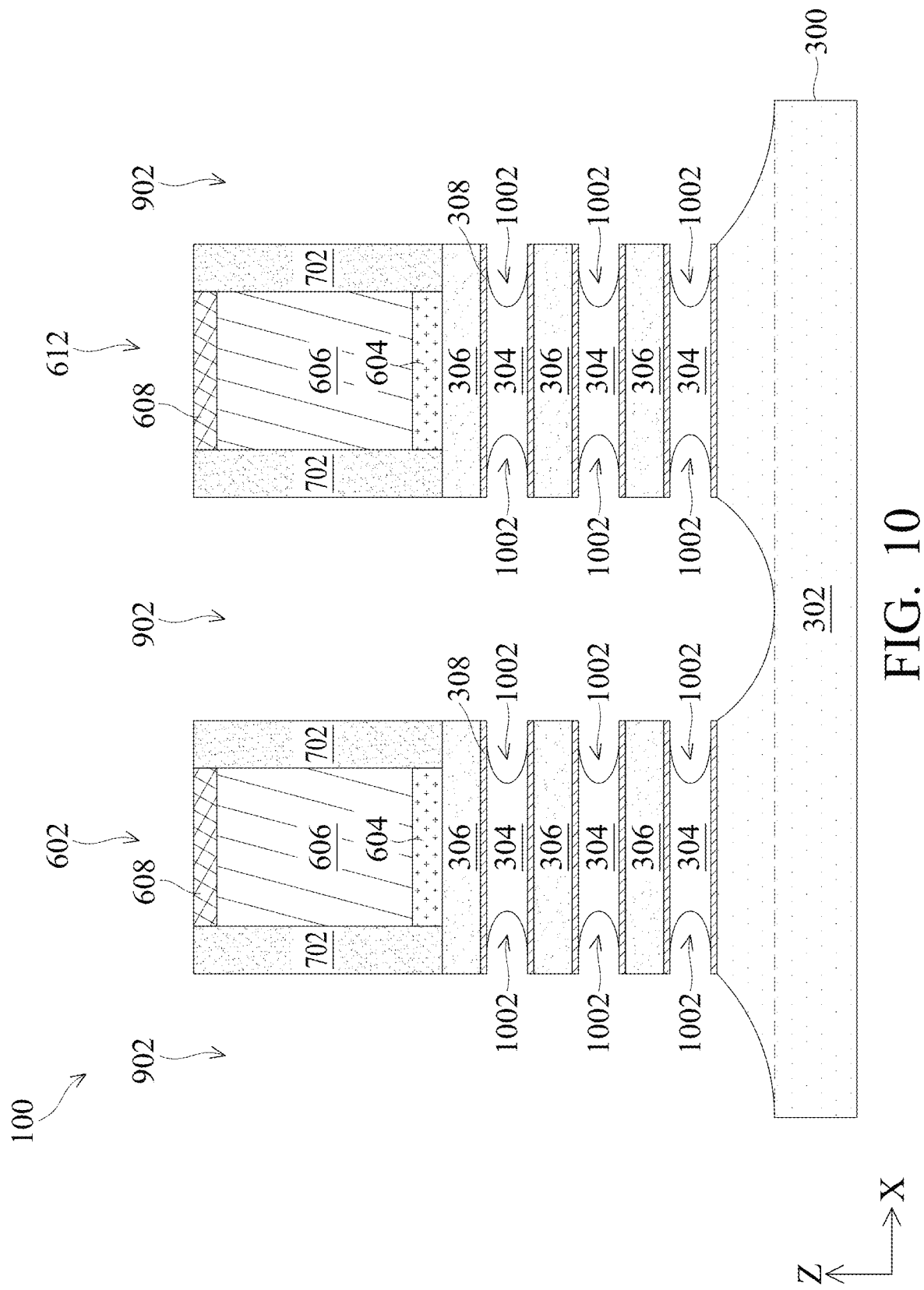

Referring to operation 2014 of FIG. 2A and FIG. 10, side portions of the semiconductor layers 304 are removed through the exposed sidewall surfaces in the source/drain trenches 902 via a selective etching process. The selective etching process may be any suitable processes, such as a wet etching or a dry etching process. As shown in FIG. 10, the selective etching process creates gaps 1002, which extend the source/drain trenches 902 into areas beneath the gate spacers 702 and between the semiconductor layers 306. In some embodiments, a first sidewall of the metal oxide layers 308 is exposed by the gaps 1002 while a second sidewall, opposite to the first sidewall, of the metal oxide layers is in direct contact with the semiconductor layers 306. In some embodiments, the semiconductor layers 306 and the metal oxide layers 308 are slightly removed during the selective etching process. In some embodiments, the semiconductor layers 304 have concave sidewalls after the selective etching process.

Figure 11:
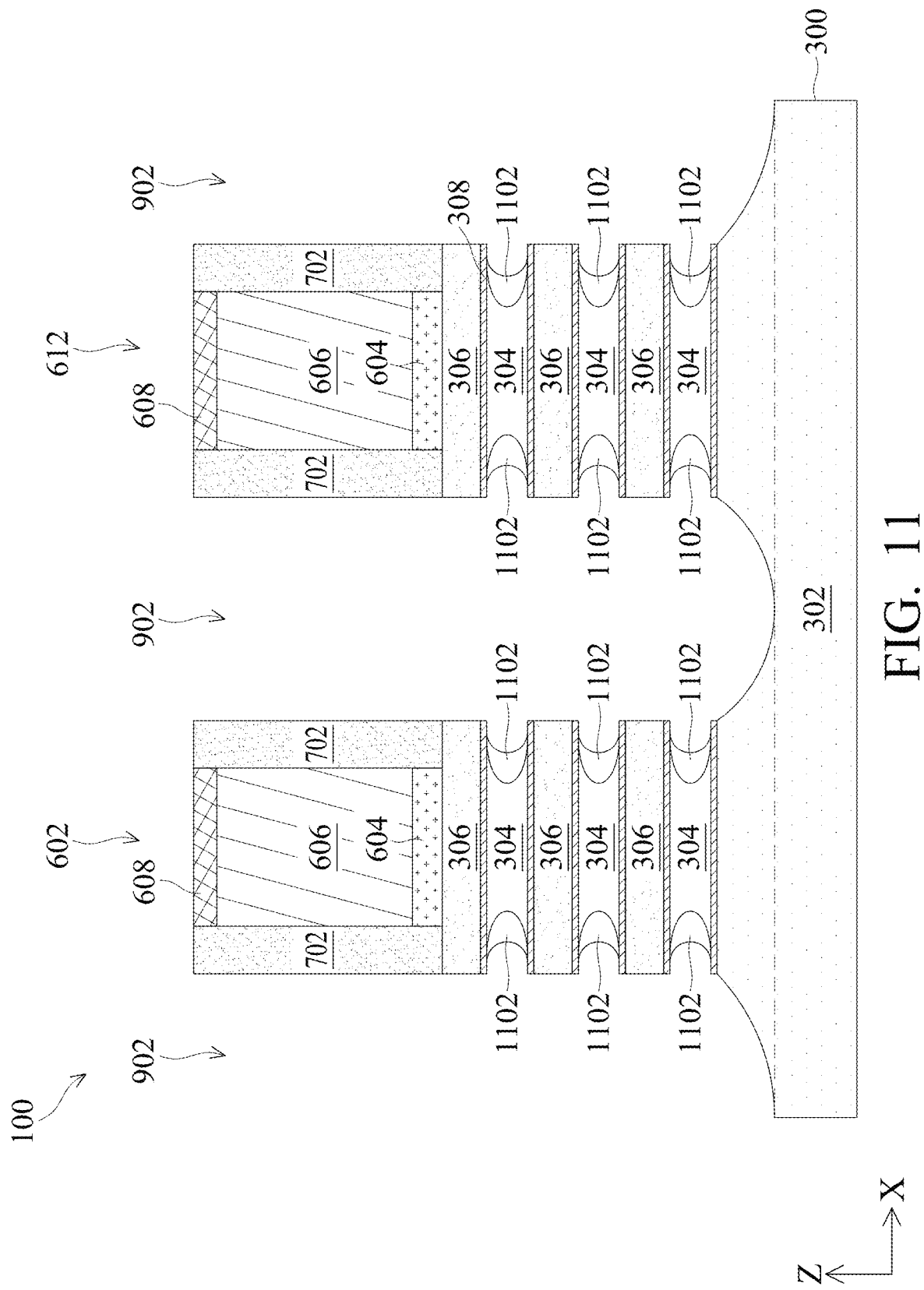

Referring to operation 2016 of FIG. 2A and FIG. 11, inner spacers 1102 are formed to fill portions of the gaps 1002. In some embodiments, and the inner spacers 1102 are in direct contact with the metal oxide layers 308. In order to form the inner spacers 1102, a dielectric material is first deposited into the source/drain trenches 902 and the gaps 1002. The dielectric material may be selected from silicon oxide ($SiO_2$), silicon oxynitride (SiON), silicon oxycarbide (SiOC), silicon oxycarbon nitride (SiOCN), or combinations thereof. The deposition of the dielectric material may be any suitable methods, such as CVD, PVD, PECVD, metal organic chemical vapor deposition (MOCVD), ALD, PEALD, or combinations thereof. Then, the dielectric material is etched back so that the dielectric material in the source/drain trenches 902 and portions of the dielectric material in the gaps 1002 are removed. As a result, the dielectric material partially fills the gaps 161, and then forms the inner spacers 1102. The inner spacers 1102 also have concave sidewalls and are sandwiched by or between two adjacent semiconductor layers 306.

One function of the inner spacers 1102 is to block the diffusion of dopants from source/drain region (formed in following processes) to the middle portions of the channel layers (formed by the semiconductor layers 306). However, edges of the concave sidewalls of the inner spacers 1102 are too thin to block the diffusion of dopants. Therefore, as shown in FIG. 11, the metal oxide layers 308 formed in above processes contact the inner spacers and interpose between the inner spacers 1102 and the semiconductor layers 306 for blocking or retarding the diffusion of dopants. In some embodiments, portions of the top surface and the bottom surface of the metal oxide layers 308 are still exposed by the gaps 1002 after the formation of the inner spacers 1102 (i.e., the inner spacers 1102 do not totally cover the top surface and the bottom surface of the metal oxide layers 308).

Figure 12:
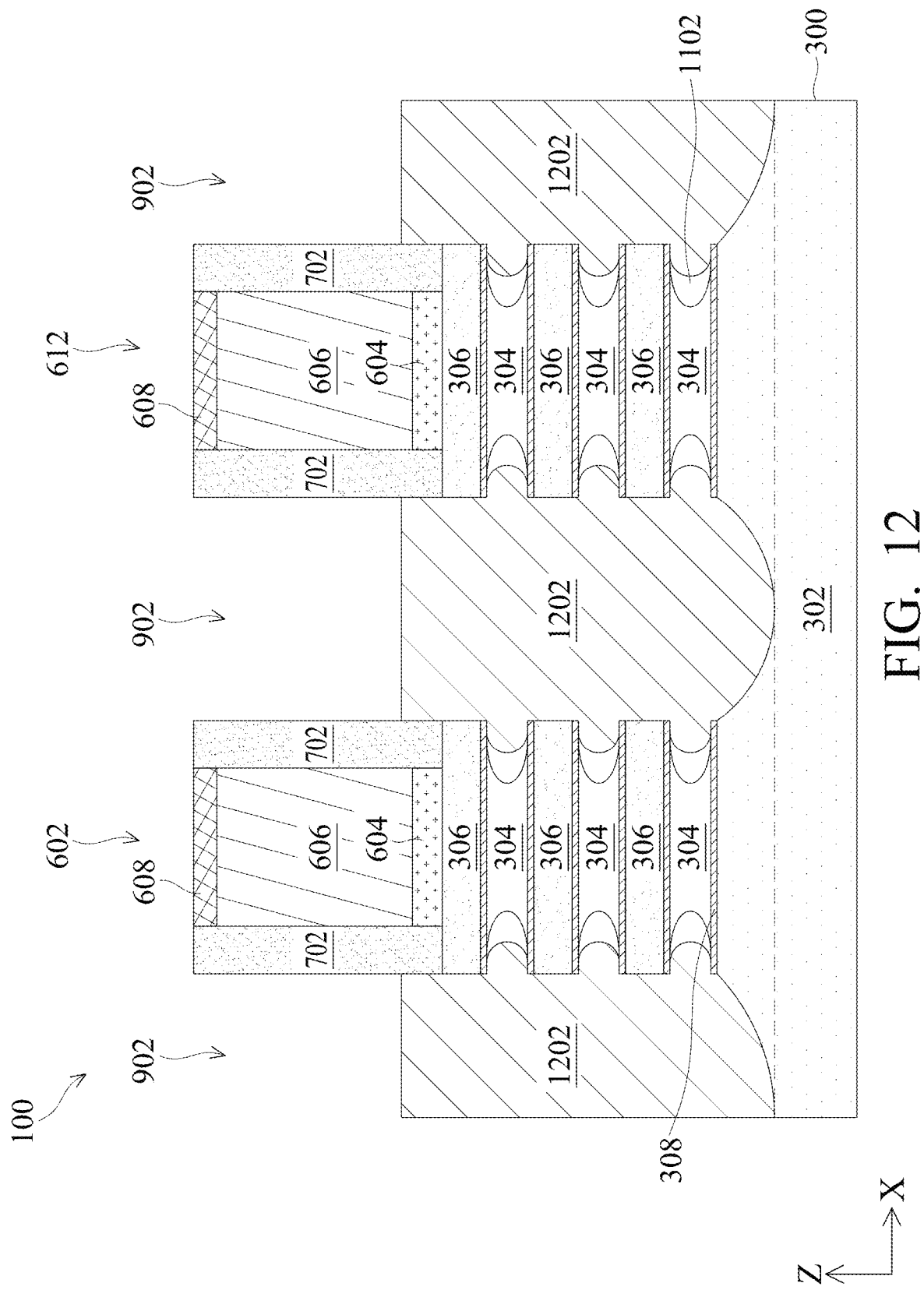

Referring to operation 2018 of FIG. 2B and FIG. 12, the method 2000 continues to forming source/drain features 1202 in the source/drain trenches 902 and the remaining portions of the gaps 1002. In some embodiments, the source/drain features 1202 are in direct contact with the metal oxide layers 308. The semiconductor layers 306 that extend from one source/drain feature 1202 to the other source/drain feature 1202 may form channels of the GAA device 100. One or more epitaxy processes may be employed to grow the source/drain features 1202. In some embodiments, the source/drain features 1202 may have top surfaces that extend higher than the top surface of the topmost semiconductor layer 306 (e.g., in the Z-direction). In some embodiments, portions of the source/drain features 1202 extend between the semiconductor layers 306 to fill the remaining portions of the gaps 1002. These portions of the source/drain features 1202 vertically overlap the gate spacers 702, the semiconductor layers 306, and the metal oxide layers 308. On the other hands, the source/drain features 1202 extend between the metal oxide layers 308 to fill the remaining portions of the gaps 1002.

Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 1202 may include any suitable semiconductor materials. For example, the source/drain features 1202 in an n-type GAA device may include silicon (Si), silicon carbide (SiC), silicon phosphide (SiP), silicon arsenide (SiAs), silicon phosphoric carbide (SiPC), or combinations thereof; while the source/drain features 1202 in a p-type GAA device may include silicon (Si), silicon germanium (SiGe), germanium (Ge), silicon germanium carbide (SiGeC), or combinations thereof. The source/drain features 1202 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 1202. The annealing processes may include rapid thermal annealing (RTA) and/or laser annealing processes.

Figure 13:
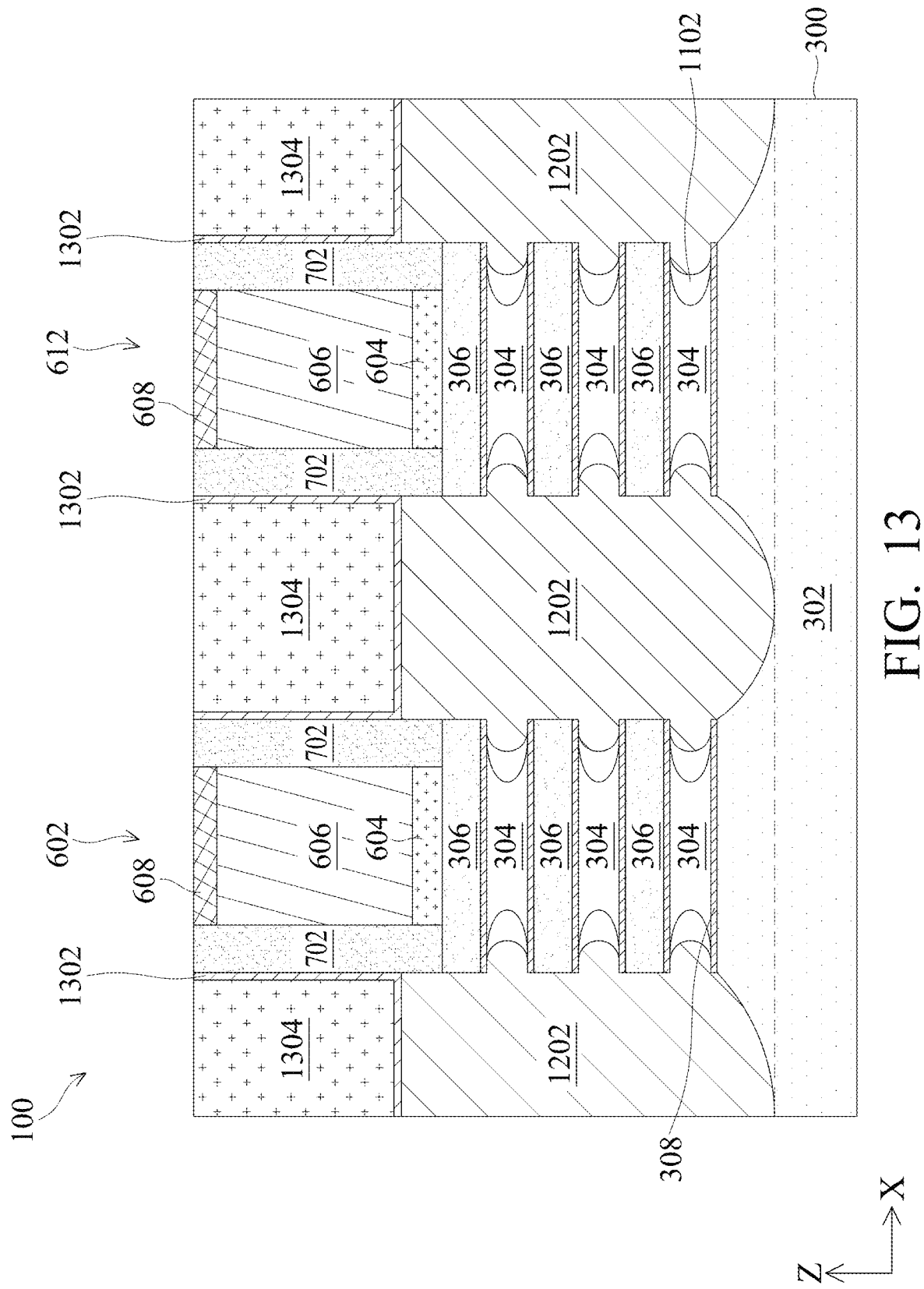

Referring to operation 2020 of FIG. 2B and FIG. 13, a contact etch stop layer (CESL) 1302 and an interlayer dielectric (ILD) layer 1304 are formed over the source/drain features 1202 and between the gate spacers 702. Specifically, the CESL 1302 is conformally formed on the sidewalls of the gate spacers 702 and over the top surfaces of the source/drain features 1202 and the dummy gate structures 602 and 612, the ILD layer 1304 is formed over the CESL 1302, and then excessive portions of the ILD layer 1304 and the CESL 1302 over the top surfaces of the dummy gate structures 602 and 612 are removed. The ILD layer 1304 may include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials may include FSG, carbon doped silicon oxide, Black Diamond® (Applied Materials of Santa Clara, California), Xerogel, Aerogel, amorphous fluorinated carbon, Parylene, BCB, SILK® (Dow Chemical, Midland, Michigan), polyimide, other low-k dielectric material, or combinations thereof. In some embodiments, The ILD layer 1304 is a dielectric layer that includes a low-k dielectric material (generally referred to as low-k dielectric layers). In some implementations, low-k dielectric material generally refers to materials having a dielectric constant (k) that is less than 3. The ILD layer 1304 may include a multilayer structure having multiple dielectric materials. The CESL 1302 may include a material different than ILD layers 352, 354, such as a dielectric material that is different than the dielectric material of the ILD layer 1304. For example, the ILD layer 1304 may include a low-k dielectric material, the CESL 1302 may include silicon and nitrogen, such as silicon nitride or silicon oxynitride. The ILD layer 1304 is formed by a deposition process, such as CVD, PVD, ALD, HDPCVD, MOCVD, RPCVD, PECVD, LPCVD, other suitable methods, or combinations thereof. In some implementations, The ILD layer 1304 is formed by a flowable CVD (FCVD) process that may include, for example, depositing a flowable material (such as a liquid compound) over the substrate 300 and converting the flowable material to a solid material by a suitable technique, such as thermal annealing and/or ultraviolet radiation treating. Subsequent to the deposition of the ILD layer 1304, a chemical mechanical polishing (CMP) process and/or other planarization process is performed, so that the ILD layer 1304 has substantially planar surfaces.

Figure 14:
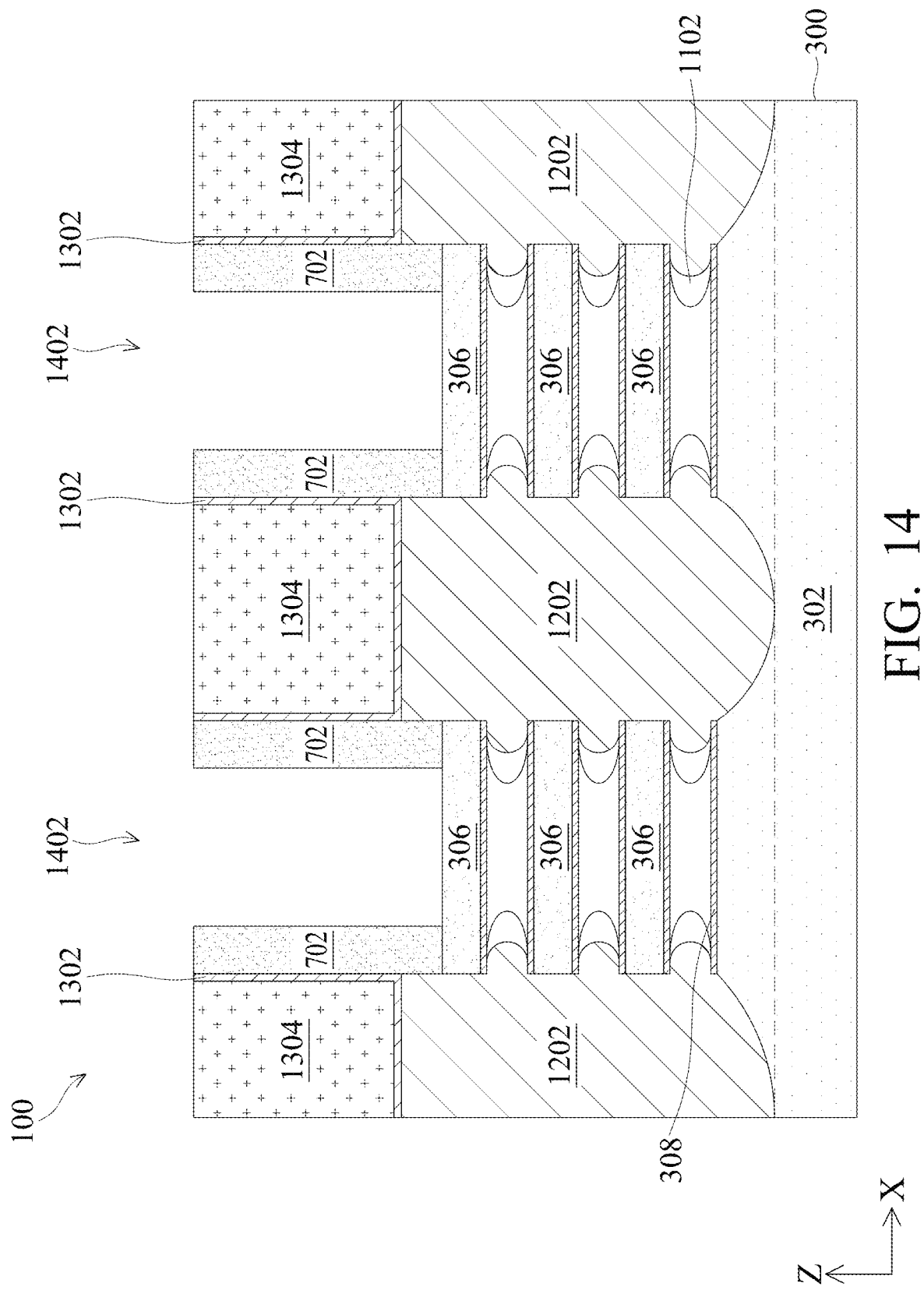

Referring to operation 2022 of FIG. 2B and FIG. 14, the dummy gate structures 602 and 612 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 602 and 612. Then, the dummy gate structures 602 and 612 are selectively etched through the masking element. In some other embodiments, the gate spacers 702 may be used as the masking element or a part thereof. Etch selectivity may be achieved by selecting the appropriate etching chemicals, and the dummy gate structures 602 and 612 may be removed without substantially affecting the features of the GAA device 100, such as the fin 402. The removal of the dummy gate structures 602 and 612 creates gate trenches 1402. The gate trenches 1402 expose the top surfaces and the side surfaces of the fin 402 that underlies the dummy gate structures 602 and 612.

Still referring to FIG. 14, the semiconductor layers 304 of the fin 402 are selectively removed through the gate trenches 1402, using a wet or dry etching process for example, so that the semiconductor layers 306 and the metal oxide layers 308 are exposed in the gate trench 1402. Such a process may also be referred to as a wire release process, a nanowire release process, a nanosheet release process, a nanowire formation process, a nanosheet formation process, or a wire formation process. As shown in FIG. 14, center portions of the semiconductor layers 306, center portions of the metal oxide layers 308, and the inner spacers 1102 remain substantially unchanged. In some embodiments, the removal of the semiconductor layers 304 causes the remaining semiconductor layers 306 to be spaced apart from each other in the vertical direction (e.g., in the Z-direction), and exposes the center portions of the top surfaces of the topmost semiconductor layer 306 and the center portions of the top and bottom surfaces of the metal oxide layers 308. The remaining semiconductor layers 306 extend longitudinally in the horizontal direction (e.g., in the X-direction), and each connects one first source/drain feature 1202 to another source/drain feature 1202.

Figure 15:
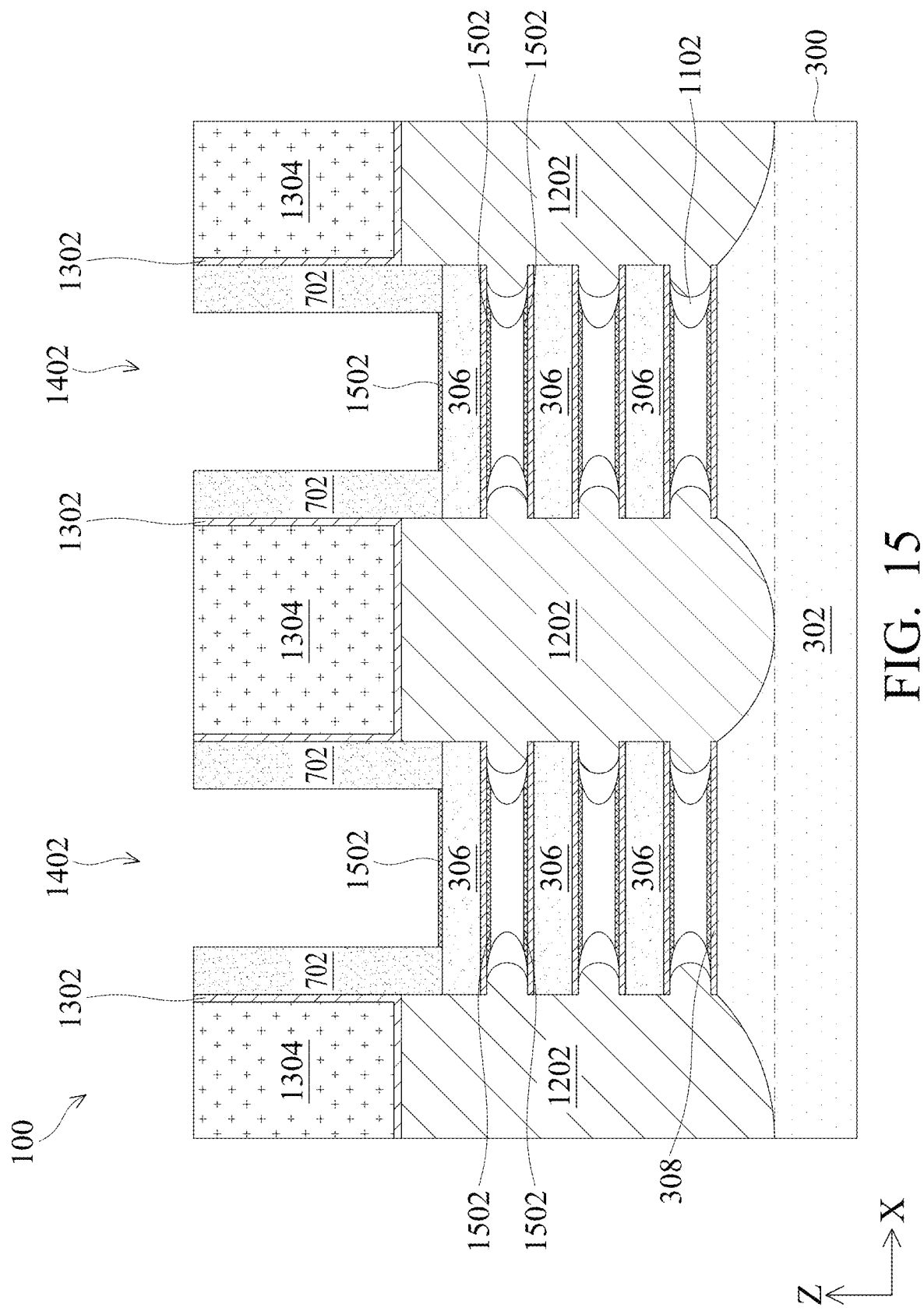

Referring to operation 2024 of FIG. 2B and FIG. 15, interfacial layers 1502 are formed in the gate trenches 1402. Specifically, the interfacial layers 1502 are formed to wrap around the center portions of the semiconductor layers 304 and the metal oxide layers 308. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

Figure 16:
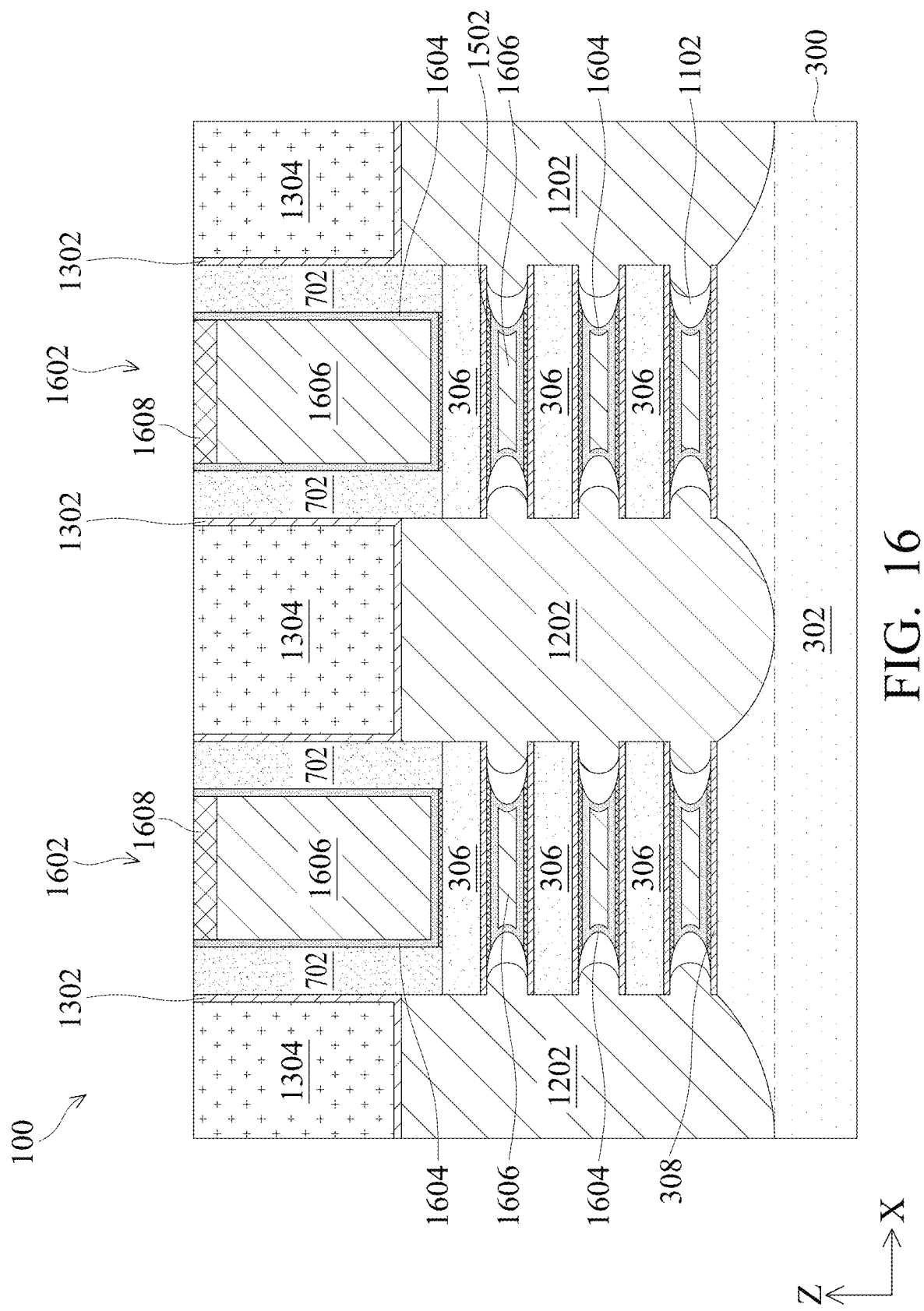

Referring to operation 2026 of FIG. 2B and FIG. 16, gate structures 1602 are formed in the gate trenches 1402. The gate structures 1602 each may include a gate dielectric layer 1604 and a gate electrode 1606 formed over the gate dielectric layer 1604. In some embodiments, the gate dielectric layer 1604 is formed to wrap around the center portions of the semiconductor layers 306, the center portions of the metal oxide layers 308, and the interfacial layers 1502. Additionally, the gate dielectric layer 1604 also directly contact convex sidewalls of the inner spacers 1102 and vertical sidewalls of the gate spacers 702. The gate dielectric layers 1604 may include a dielectric material having a dielectric constant greater than a dielectric constant of $SiO_2$, which is approximately 3.9. For example, the gate dielectric layers 1604 may include hafnium oxide ($HfO_2$), which has a dielectric constant in a range from about 18 to about 40. Alternatively, the gate dielectric layers 1604 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 1604 may be formed by ALD, PVD, CVD, oxidation, and/or other suitable methods.

The gate electrode 1606 is formed to fill the remaining spaces of the gate trenches 1402 in such a way that the gate electrode 1606 wraps around the center portions of the semiconductor layers 306, the center portions of the metal oxide layers 308, and the interfacial layers 1502. The gate electrode 1606 may include a single layer or alternatively a multi-layer structure. In some embodiments, the gate electrode 1606 may include a capping layer, a barrier layer, an n-type work function metal layer, a p-type work function metal layer, and a fill material (not shown).

The capping layer may be formed adjacent to the gate dielectric layers 1604 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

In some embodiments, a gate top hard mask layer 1608 may optionally be formed over the gate structures 1602. For example, referring to FIG. 16, the gate electrodes 1606 may optionally be recessed, so that the top surfaces of the gate electrodes 1606 can extend below the top surface of the ILD layer 1304. Subsequently, the gate top hard mask layer 1608 is formed over the GAA device 100 in such a way that it covers the gate structures 1602 (specifically, the gate electrodes 1606 and the gate dielectric layers 1604), the gate spacers 702, and the ILD layer 1304, and fills the space created by the recess process. A CMP may be conducted to planarize the top surface of the gate top hard mask layer 1608. In some embodiments, the CMP exposes the top surfaces of the ILD layer 1304, the top surfaces of the gate spacers 702, and the top surfaces of the gate dielectric layers 1604. The gate top hard mask layers 1608 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. The gate top hard mask layer 1608 protects the gate structures 1602 in the subsequent etching processes to form the source/drain contact features, and also insulates the gate structures 1602. However, in some other embodiments, the recessing of the gate electrodes 1606 and/or the formation of the gate top hard mask layer 1608 is omitted.

Figure 17:
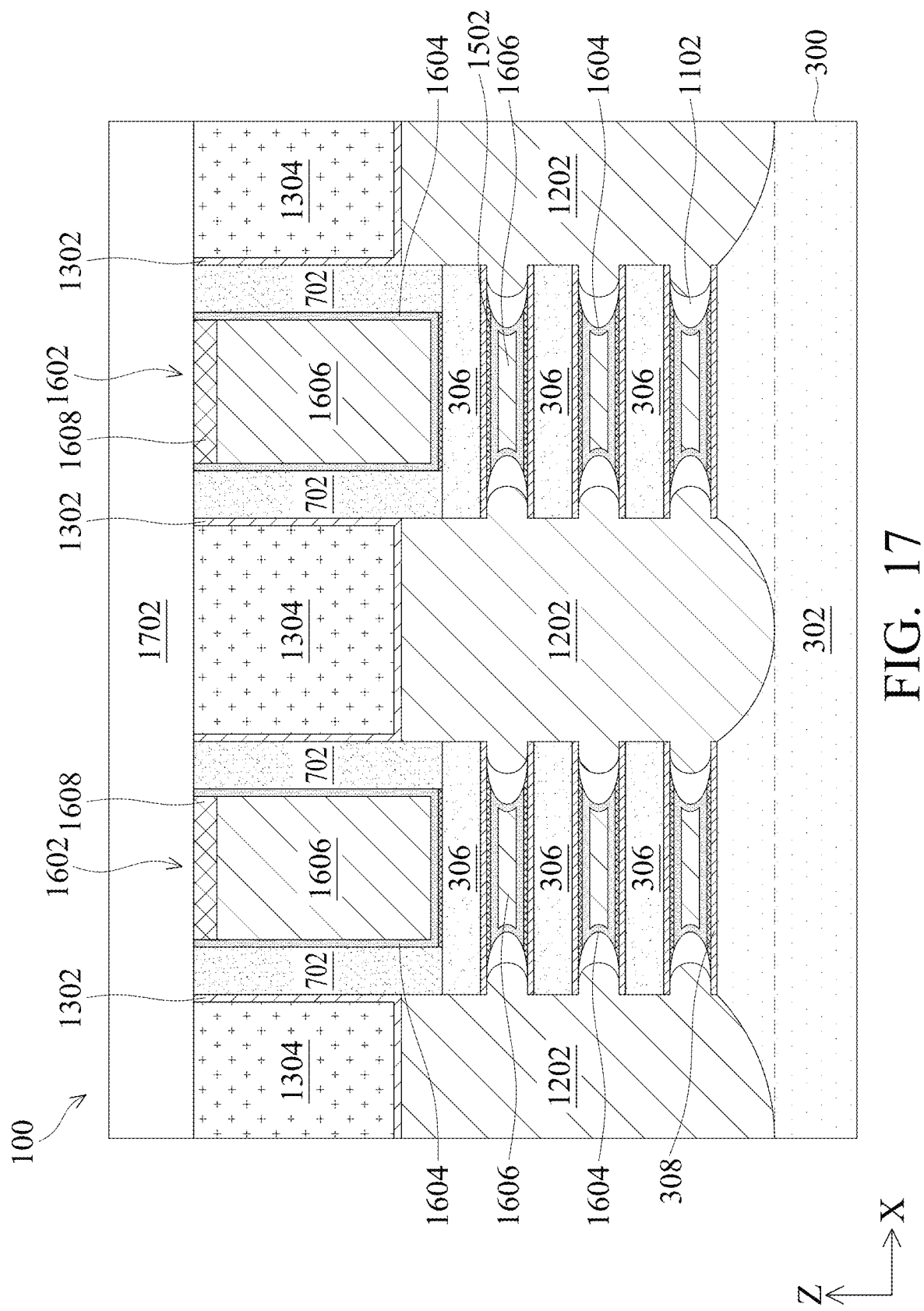

Referring to operation 2028 of FIG. 2B and FIG. 17, a dielectric layer 1702 is formed over the GAA device 100. The dielectric layer 1702 may be formed by any suitable processes, such as CVD, PECVD, flowable CVD (FCVD), or combinations thereof. The dielectric layer 1702 covers top surfaces of the ILD layer 1304, the gate spacers 702, the gate structures 1602, and the gate top hard mask layer 1608 (if present). The dielectric layer 1702 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. In some embodiments, the dielectric layer 1702 protects the gate structures 1602 in the subsequent etching processes to form the source/drain contact features.

Figure 18:
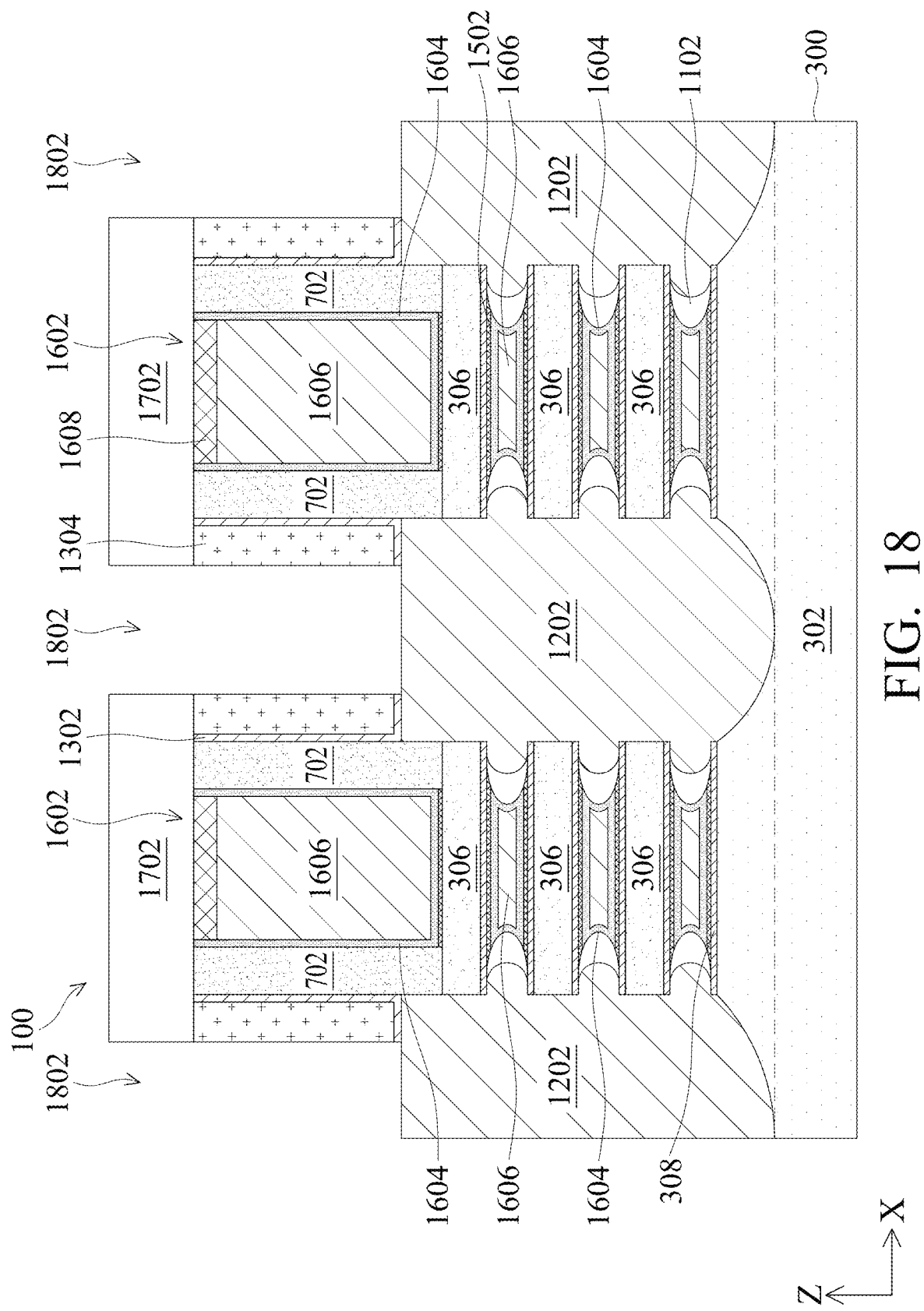

Referring to operation 2030 of FIG. 2B and FIG. 18, a portion of the dielectric layer 1702 and the ILD layer 1304 are removed to form source/drain contact holes 1802 over the source/drain features 1202. Any appropriate methods may be used to form the source/drain contact holes 1802, such as multiple lithography and etching steps. The source/drain contact holes 1802 pass through the ILD layer 1304 and the CESL 1302, and expose the top surfaces of the source/drain features 1202 for subsequent source/drain contact formation. Additionally, in some embodiments, a portion of the dielectric layer 1702 and the gate top hard mask layer 1608 (if present) are also removed to form gate contact holes over the gate electrodes 1606 of the gate structures 1602. The gate contact holes expose the gate electrodes 1606 for subsequent gate contact formation. In some embodiments, the gate contact holes are not formed in FIG. 18, but the gate contact holes are formed in other cross-sectional views of the GAA device 100. Any appropriate methods may be used to form the gate contact holes and may include multiple lithography and etching steps.

Figure 19:
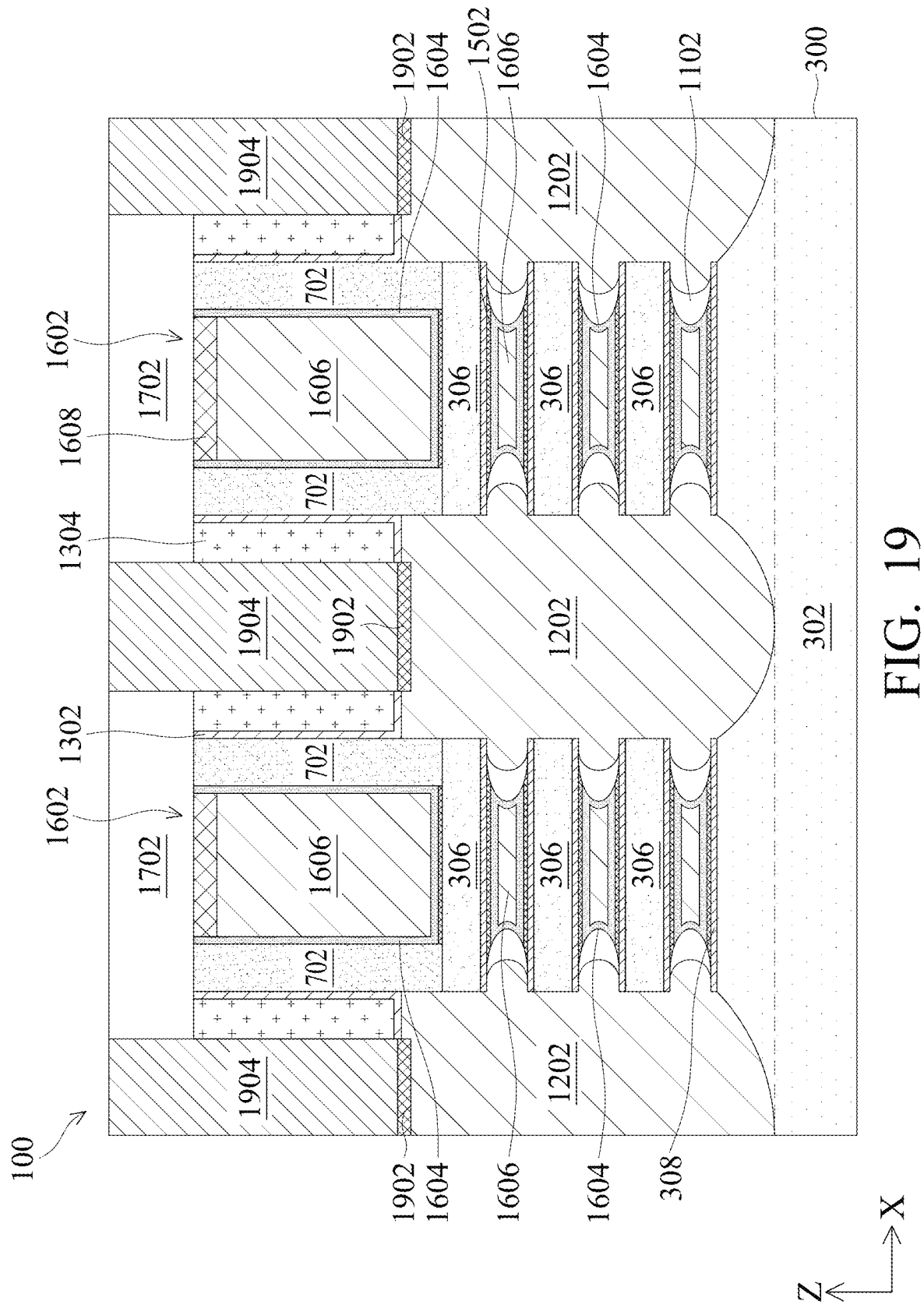

Referring to operation 2032 of FIG. 2B and FIG. 19, source/drain contact features 1904 are formed within the source/drain contact holes 1802. Accordingly, the source/drain contact features 1904 are embedded within the dielectric layer 1702 and the ILD layer 1304, and electrically connect the source/drain features 1202. As discussed above, the gate contact holes may be formed in other cross-sectional views. The gate contact features are also formed within the gate contact holes and are embedded within the dielectric layer 1702 (and within the gate top hard mask layer 1608, if present). Accordingly, the gate contact features are electrically connect the gate structures to external conductive features (not shown). The source/drain contact features 1904 and the gate contact features may each include a conductive material such as Al, Cu, W, Co, Ti, Ta, Ru, TiN, TiAl, TiAlN, TaN, TaC, NiSi, CoSi, combinations of these, or the like, although any suitable material may be deposited using a deposition process such as sputtering, CVD, electroplating, electroless plating, or the like. Once filled or overfilled, any deposited material outside of the contact holes may be removed using a planarization process such as CMP. However, any suitable material and process of formation may be utilized.

In some embodiments, additional features are formed in between the source/drain features 1202 and the source/drain contact features 1904, such as silicide features 1902. The silicide features 1902 may include titanium, nickel, cobalt, or erbium in order to reduce the Schottky barrier height of the source/drain contact features 1904. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process.

Figure 20:
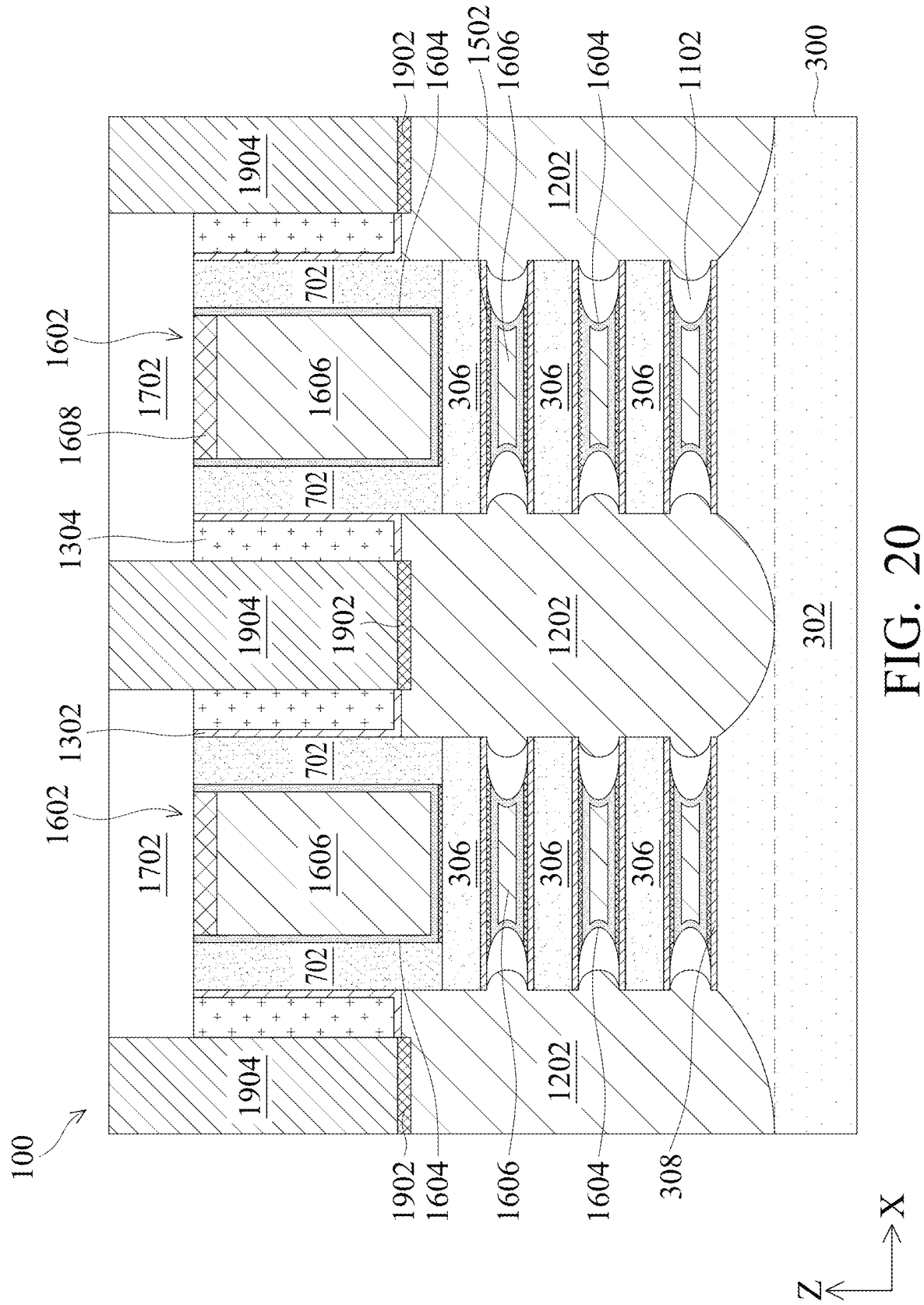
FIG. 20 is cross sectional views of another embodiment of a GAA device of the present disclosure, in accordance with some embodiments.

In some embodiments, portions of the top surfaces and the bottom surfaces of the metal oxide layers 308 are not covered by the inner spacers 1102 and contact the source/drain features 1202. In some other embodiments, the top surfaces and the bottom surfaces of the metal oxide layers 308 are fully covered by the inner spacers 1102, as shown in FIG. 20. Similarly, edges of the concave sidewalls of the inner spacers 1102 are also too thin to block the diffusion of dopants form the source/drain features 1202. Therefore, the metal oxide layers 308 formed in above processes are used to block or retard the diffusion of dopants from the source/drain features 1202.

The embodiments disclosed herein relate to semiconductor structures and their manufacturing methods, and more particularly to semiconductor devices comprising a gate-all-around (GAA) structure with metal oxide layers interposing between inner spacers and semiconductor layers (channel layers). Furthermore, the present embodiments provide one or more of the following advantages. The metal oxide layers interposing between the inner spacers and the channel layers may block or retard dopants that are out-diffused from the well and the source/drain regions. This may stop the degradation of the characteristics of the GAA devices that can be caused by the dopants not diffusing into the middle portions of the channel regions. As a result, the short channel effect (SCE), the carrier mobility, and the sub-threshold leakage current of the SRAM and logic cells having such GAA devices may be improved. The threshold voltage variation of a GAA device with metal oxide layers shows an improvement of about 20% to 36% over one without metal oxide layers. The minimum operating voltage (Vccmin) of a SRAM cells including GAA devices with metal oxide layers shows an improvement of about 10% to 18% over one without metal oxide layers. The sub-threshold leakage current of a GAA device with metal oxide layers shows a reduction of about 10% to about 35% over one without metal oxide layers. The drain-induced barrier lowering (DIBL) effect of a GAA device with metal oxide layers shows an improvement of about 10% to 25% over one without metal oxide layers. The carrier mobility of a GAA device with metal oxide layers shows an improvement of about 10% to 35% over one without metal oxide layers.

Thus, one of the embodiments of the present disclosure described a semiconductor structure including substrate, semiconductor layers, source/drain features, metal oxide layers, and a gate structure. The semiconductor layers extend in an X-direction and over the substrate. The semiconductor layers are spaced apart from each other in a Z-direction. The source/drain features are on opposite sides of the semiconductor layers in the X-direction. The metal oxide layers cover bottom surfaces of the semiconductor layers. The gate structure wraps around the semiconductor layers and the metal oxide layers. The metal oxide layers are in contact with the gate structure.

In another of the embodiments, discussed is a semiconductor structure including a substrate, a first semiconductor layer, a second semiconductor layer, source/drain features, rare earth oxide layers, and a gate structure. The first semiconductor layer is over the semiconductor substrate in a Z-direction. The second semiconductor layer is over and spaced apart from the first semiconductor layer in the Z-direction. The source/drain features are on opposite sides of the first semiconductor layer and the second semiconductor layer in an X-direction. The rare earth oxide layers are on top surfaces and bottom surfaces of the first semiconductor layer and the second semiconductor layer. The gate structure wraps around center portions of the first semiconductor layer, the second semiconductor layer, and the rare earth oxide layers. The rare earth oxide layers are in contact with the gate structure in the Z-direction.

In yet another of the embodiments, discussed is a semiconductor structure that includes substrate, semiconductor layers, source/drain features, metal oxide layers, inner spacers, and a gate structure. The semiconductor layers extend in an X-direction and over the substrate. The semiconductor layers are spaced apart from each other in a Z-direction. The source/drain features are on opposite sides of the semiconductor layers in the X-direction. The metal oxide layers cover top surfaces and bottom surfaces of the semiconductor layers. The inner spacers are between the metal oxide layers in the Z-direction. The gate structure wraps around the semiconductor layers and the metal oxide layers. The metal oxide layers are in contact with the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    semiconductor layers extending in an X-direction and over the substrate, wherein the semiconductor layers are spaced apart from each other in a Z-direction;
    source/drain features on opposite sides of the semiconductor layers in the X-direction;
    metal oxide layers covering bottom surfaces of the semiconductor layers; and
    a gate structure wrapping around the semiconductor layers and the metal oxide layers, wherein center portions of the metal oxide layers covering the bottom surfaces of the semiconductor layers are in contact with the gate structure.

2. The semiconductor structure of claim 1, further comprising:
    inner spacers between the semiconductor layers in the Z-direction, wherein the inner spacers are in contact with the metal oxide layers.

3. The semiconductor structure of claim 1, wherein the metal oxide layers comprise lanthanum, gadolinium, yttrium, and combinations thereof.

4. The semiconductor structure of claim 1, wherein a thickness of the metal oxide layers is in a range from about 1 nanometer to about 5 nanometers.

5. The semiconductor structure of claim 1, wherein portions of the source/drain features are between the semiconductor layers in the Z-direction, wherein the portions of the source/drain features are in contact with the metal oxide layers.

6. The semiconductor structure of claim 1, wherein the gate structure further comprising:
    an interfacial layer wrapping around the semiconductor layers and the metal oxide layers;
    a gate dielectric layer wrapping around the interfacial layer; and
    a gate electrode wrapping around the gate dielectric layer.

7. A semiconductor structure, comprising:
    a substrate;
    a first semiconductor layer over the semiconductor substrate in a Z-direction;
    a second semiconductor layer over and spaced apart from the first semiconductor layer in the Z-direction;
    source/drain features on opposite sides of the first semiconductor layer and the second semiconductor layer in an X-direction;
    rare earth oxide layers on top surfaces and bottom surfaces of the first semiconductor layer and the second semiconductor layer; and
    a gate structure wrapping around center portions of the first semiconductor layer, the second semiconductor layer, and the rare earth oxide layers, wherein the center portions of the rare earth oxide layers are in contact with the gate structure in the Z-direction.

8. The semiconductor structure of claim 7, wherein the rare earth oxide layers comprise lanthanum oxide, gadolinium oxide, yttrium oxide, and combinations thereof.

9. The semiconductor structure of claim 7, wherein the rare earth oxide layers comprise a crystal structure of a hexagonal phase.

10. The semiconductor structure of claim 7, further comprising:
    gate spacers on opposite sides of the gate structure and overlapping the rare earth oxide layers.

11. The semiconductor structure of claim 7, wherein portions of the source/drain features are between the rare earth oxide layers in the Z-direction.

12. The semiconductor structure of claim 11, wherein the portions of the source/drain features comprise convex sidewalls.

13. A semiconductor structure, comprising:
    a substrate;
    semiconductor layers extending in an X-direction and over the substrate, wherein the semiconductor layers are spaced apart from each other in a Z-direction;
    source/drain features on opposite sides of the semiconductor layers in the X-direction;
    metal oxide layers covering top surfaces and bottom surfaces of the semiconductor layers;
    inner spacers between the metal oxide layers in the Z-direction; and
    a gate structure wrapping around the semiconductor layers and the metal oxide layers, wherein center portions of the metal oxide layers are in contact with the gate structure in the Z-direction.

14. The semiconductor structure of claim 13, wherein the metal oxide layers are fabricated by atom layer deposition.

15. The semiconductor structure of claim 13, further comprising:
    gate spacers on opposite sides of the gate structure and over a topmost surface of the semiconductor layers.

16. The semiconductor structure of claim 13, wherein the inner spacers comprise convex sidewalls in contact with the gate structure.

17. The semiconductor structure of claim 13, wherein portions of the source/drain features are between the rare earth oxide layers in the Z-direction.

18. The semiconductor structure of claim 17, wherein the portions of the source/drain features are in contact with the rare earth oxide layers.

19. The semiconductor structure of claim 17, wherein the portions of the source/drain features are separated from the rare earth oxide layers by the inner spacers.

20. The semiconductor structure of claim 13, metal oxide layers comprise a metal material selected from the group consisting of lanthanum, gadolinium, yttrium, and combinations thereof.

* * * * *